(12) United States Patent
Rathburn

(10) Patent No.: US 9,930,775 B2
(45) Date of Patent: Mar. 27, 2018

(54) COPPER PILLAR FULL METAL VIA ELECTRICAL CIRCUIT STRUCTURE

(71) Applicant: HSIO TECHNOLOGIES, LLC, Maple Grove, MN (US)

(72) Inventor: Jim Rathburn, Maple Grove, MN (US)

(73) Assignee: HSIO Technologies, LLC, Maple Grove, MN (US)

( * ) Notice: Subject to any disclaimer, the term of this patent is extended or adjusted under 35 U.S.C. 154(b) by 654 days.

(21) Appl. No.: 14/255,083

(22) Filed: Apr. 17, 2014

(65) Prior Publication Data

US 2014/0225255 A1 Aug. 14, 2014

Related U.S. Application Data

(63) Continuation-in-part of application No. 13/413,724, filed on Mar. 7, 2012, now Pat. No. 8,987,886, and a
(Continued)

(51) Int. Cl.
*H01L 23/12* (2006.01)
*H01L 23/00* (2006.01)
(Continued)

(52) U.S. Cl.
CPC ..... *H05K 1/0298* (2013.01); *H01L 23/49827* (2013.01); *H01L 23/49894* (2013.01);
(Continued)

(58) Field of Classification Search
CPC ......... H01L 23/49827; H01L 23/49894; H01L 2924/12042; H01L 2224/08235;
(Continued)

(56) References Cited

U.S. PATENT DOCUMENTS 3,672,986 A  6/1972  Schneble, Jr. et al.
4,188,438 A  2/1980  Burns
(Continued)

FOREIGN PATENT DOCUMENTS

JP   2003/217774     7/2003
WO   WO 1991/014015  9/1991
(Continued)

OTHER PUBLICATIONS

Notice of Allowance and Fee(s) Due dated Apr. 9, 2015 in co-pending U.S. Appl. No. 13/266,573, now U.S. Pat. No. 9,054,097.
(Continued)

*Primary Examiner* — Peniel M Gumedzoe

(57) ABSTRACT

An electrical interconnect including a first circuitry layer with a first surface and a second surface. A first liquid dielectric layer is imaged directly on the first surface of the first circuitry layer to form a first dielectric layer with a plurality of first recesses. Conductive plating substantially fills a plurality of the first recesses to create a plurality of first solid copper conductive pillars electrically coupled to, and extending generally perpendicular to, the first circuitry layer. A second liquid dielectric layer is imaged directly on the first dielectric layer to form a second dielectric layer with a plurality of second recesses. Conductive plating substantially fills a plurality of the second recesses to form a plurality of second solid copper conductive pillars electrically coupled to, and extending parallel with, the first conductive pillars. An IC device is electrically coupled to a plurality of the second conductive pillars.

16 Claims, 16 Drawing Sheets

Related U.S. Application Data continuation-in-part of application No. 13/266,573, filed as application No. PCT/US2010/036363 on May 27, 2010, now Pat. No. 9,054,097, and a continuation-in-part of application No. 13/318,181, filed as application No. PCT/US2010/036055 on May 25, 2010, now Pat. No. 8,955,216, and a continuation-in-part of application No. 13/318,200, filed as application No. PCT/US2010/036288 on May 27, 2010, now Pat. No. 9,136,196, and a continuation-in-part of application No. 13/318,382, filed as application No. PCT/US2010/036313 on May 27, 2010, now Pat. No. 9,231,328, and a continuation-in-part of application No. 13/319,203, filed as application No. PCT/US2010/040188 on Jun. 28, 2010, now Pat. No. 8,981,809.

(60) Provisional application No. 61/451,685, filed on Mar. 11, 2011, provisional application No. 61/183,411, filed on Jun. 2, 2009, provisional application No. 61/183,365, filed on Jun. 2, 2009, provisional application No. 61/183,356, filed on Jun. 2, 2009, provisional application No. 61/183,335, filed on Jun. 2, 2009, provisional application No. 61/221,356, filed on Jun. 29, 2009.

(51) Int. Cl.

| | | |
|---|---|---|
| *H05K 1/11* | (2006.01) | |
| *H05K 1/02* | (2006.01) | |
| *H05K 3/46* | (2006.01) | |
| *G02B 6/36* | (2006.01) | |
| *G02B 6/42* | (2006.01) | |
| *H01L 23/31* | (2006.01) | |
| *H01L 23/498* | (2006.01) | |
| *H01L 21/48* | (2006.01) | |
| *H01L 23/60* | (2006.01) | |
| *H01L 25/16* | (2006.01) | |

(52) U.S. Cl.
CPC .......... *H05K 3/4644* (2013.01); *G02B 6/3608* (2013.01); *G02B 6/4281* (2013.01); *H01L 21/486* (2013.01); *H01L 23/3128* (2013.01); *H01L 23/49816* (2013.01); *H01L 23/49822* (2013.01); *H01L 23/60* (2013.01); *H01L 24/08* (2013.01); *H01L 24/13* (2013.01); *H01L 24/16* (2013.01); *H01L 24/48* (2013.01); *H01L 25/16* (2013.01); *H01L 2223/6627* (2013.01); *H01L 2224/0401* (2013.01); *H01L 2224/08235* (2013.01); *H01L 2224/1132* (2013.01); *H01L 2224/131* (2013.01); *H01L 2224/16225* (2013.01); *H01L 2224/16235* (2013.01); *H01L 2224/48091* (2013.01); *H01L 2224/48227* (2013.01); *H01L 2224/48235* (2013.01); *H01L 2224/81192* (2013.01); *H01L 2924/00014* (2013.01); *H01L 2924/09701* (2013.01); *H01L 2924/12042* (2013.01); *H01L 2924/12044* (2013.01); *H01L 2924/1306* (2013.01); *H01L 2924/15311* (2013.01); *H01L 2924/3011* (2013.01); *H01L 2924/3025* (2013.01); *H01L 2924/381* (2013.01); *H05K 1/113* (2013.01); *H05K 2201/096* (2013.01); *H05K 2201/09563* (2013.01); *H05K 2203/0733* (2013.01); *H05K 2203/1476* (2013.01)

(58) Field of Classification Search
CPC ... H01L 2924/1306; H01L 2924/12044; H01L 23/3128; H01L 23/49816; H01L 23/49822; H01L 21/486; H01L 23/60; H01L 24/08; H01L 24/13; H01L 24/16; H01L 24/48; H01L 25/16; H01L 2223/6627; H01L 2224/0401; H01L 2224/1132; H01L 2224/131; H01L 2224/16225; H01L 2224/16235; H01L 2224/48091; H01L 2224/48227; H01L 2224/48235; H01L 2224/81192; H01L 2924/00014; H01L 2924/09701; H01L 2924/15311; H01L 2924/3011; H01L 2924/3025; H01L 2924/381; H05K 3/4644; H05K 1/0298; H05K 1/113; H05K 2201/09563; H05K 2201/096; H05K 2203/0733; H05K 2203/1476; G02B 6/3608; G02B 6/4281
See application file for complete search history.

(56) References Cited

U.S. PATENT DOCUMENTS

| | | |
|---|---|---|
| 4,295,700 A | 10/1981 | Sado |
| 4,489,999 A | 12/1984 | Miniet |
| 4,922,376 A | 5/1990 | Pommer et al. |
| 4,964,948 A | 10/1990 | Reed |
| 5,014,159 A | 5/1991 | Butt |
| 5,071,363 A | 12/1991 | Reylek et al. |
| 5,072,520 A | 12/1991 | Nelson |
| 5,096,426 A | 3/1992 | Simpson et al. |
| 5,127,837 A | 7/1992 | Shah et al. |
| 5,129,573 A | 7/1992 | Duffey |
| 5,161,983 A | 11/1992 | Ohno |
| 5,167,512 A | 12/1992 | Walkup |
| 5,208,068 A | 5/1993 | Davis et al. |
| 5,237,203 A | 8/1993 | Massaron |
| 5,239,448 A * | 8/1993 | Perkins ............... H01L 23/5385 174/266 |
| 5,246,880 A | 9/1993 | Reele et al. |
| 5,286,680 A | 2/1994 | Cain |
| 5,334,029 A | 8/1994 | Akkapeddi et al. |
| 5,358,621 A | 10/1994 | Oyama |
| 5,378,981 A | 1/1995 | Higgins, III |
| 5,419,038 A | 5/1995 | Wang et al. |
| 5,454,161 A * | 10/1995 | Beilin ................... H01L 21/486 257/E23.067 |
| 5,479,319 A | 12/1995 | Werther et al. |
| 5,509,019 A | 4/1996 | Yamamura |
| 5,527,998 A | 6/1996 | Anderson et al. |
| 5,562,462 A | 10/1996 | Matsuba et al. |
| 5,659,181 A | 8/1997 | Bridenbaugh |
| 5,674,595 A | 10/1997 | Busacco et al. |
| 5,691,041 A | 11/1997 | Frankeny et al. |
| 5,716,663 A | 2/1998 | Capote et al. |
| 5,741,624 A | 4/1998 | Jeng et al. |
| 5,746,608 A | 5/1998 | Taylor |
| 5,761,801 A | 6/1998 | Gebhardt et al. |
| 5,764,485 A | 6/1998 | Lebaschi |
| 5,772,451 A | 6/1998 | Dozler et al. |
| 5,785,538 A | 7/1998 | Beaman et al. |
| 5,787,976 A | 8/1998 | Hamburgen et al. |
| 5,802,699 A | 9/1998 | Fjelstad et al. |
| 5,802,711 A | 9/1998 | Card et al. |
| 5,819,579 A | 10/1998 | Roberts |
| 5,904,546 A | 5/1999 | Wood et al. |
| 5,913,109 A | 6/1999 | Distefano et al. |
| 5,921,786 A | 7/1999 | Slocum et al. |
| 5,925,931 A | 7/1999 | Yamamoto |
| 5,933,558 A | 8/1999 | Sauvageau et al. |
| 5,973,394 A | 10/1999 | Slocum et al. |
| 6,020,597 A | 2/2000 | Kwak |
| 6,062,879 A | 5/2000 | Beaman et al. |
| 6,080,932 A | 6/2000 | Smith et al. |
| 6,107,109 A | 8/2000 | Akram et al. |
| 6,114,240 A | 9/2000 | Akram et al. |
| 6,118,426 A | 9/2000 | Albert |

(56) References Cited

U.S. PATENT DOCUMENTS

| | | | |
|---|---|---|---|
| 6,120,588 A | 9/2000 | Jacobson |
| 6,137,687 A | 10/2000 | Shirai et al. |
| 6,172,879 B1 | 1/2001 | Cilia et al. |
| 6,177,921 B1 | 1/2001 | Comiskey |
| 6,178,540 B1 | 1/2001 | Lo et al. |
| 6,181,144 B1 | 1/2001 | Hembree et al. |
| 6,200,143 B1 | 3/2001 | Haba et al. |
| 6,207,259 B1 | 3/2001 | Iino et al. |
| 6,225,692 B1 | 5/2001 | Hinds |
| 6,247,938 B1 | 6/2001 | Rathburn |
| 6,252,564 B1 | 6/2001 | Albert |
| 6,255,126 B1 | 7/2001 | Mathieu et al. |
| 6,263,566 B1 | 7/2001 | Hembree et al. |
| 6,270,363 B1 | 8/2001 | Brofman et al. |
| 6,288,451 B1 | 9/2001 | Tsao |
| 6,312,971 B1 | 11/2001 | Amundson |
| 6,313,528 B1 | 11/2001 | Solberg |
| 6,320,256 B1 | 11/2001 | Ho |
| 6,350,386 B1 | 2/2002 | Lin |
| 6,359,790 B1 | 3/2002 | Meyer-Berg |
| 6,413,790 B1 | 7/2002 | Duthaler |
| 6,422,687 B1 | 7/2002 | Jacobson |
| 6,428,328 B2 | 8/2002 | Haba et al. |
| 6,437,452 B2 | 8/2002 | Lin |
| 6,437,591 B1 | 8/2002 | Farnworth et al. |
| 6,459,418 B1 | 10/2002 | Comiskey |
| 6,461,183 B1 | 10/2002 | Ohkita |
| 6,462,418 B2 | 10/2002 | Sakamoto et al. |
| 6,462,568 B1 | 10/2002 | Cram |
| 6,477,286 B1 | 11/2002 | Ouchi |
| 6,490,786 B2 | 12/2002 | Belke et al. |
| 6,494,725 B2 | 12/2002 | Lin et al. |
| 6,506,438 B2 | 1/2003 | Duthaler et al. |
| 6,521,489 B2 | 2/2003 | Duthaler |
| 6,534,723 B1* | 3/2003 | Asai ............ H01L 23/49811 |
| | | 174/255 |
| 6,545,291 B1 | 4/2003 | Amundson |
| 6,572,396 B1 | 6/2003 | Rathburn |
| 6,574,114 B1 | 6/2003 | Brindle et al. |
| 6,593,535 B2 | 7/2003 | Gailus |
| 6,603,080 B2 | 8/2003 | Jensen |
| 6,614,104 B2 | 9/2003 | Farnworth et al. |
| 6,626,526 B2 | 9/2003 | Ueki |
| 6,639,578 B1 | 10/2003 | Comiskey |
| 6,642,127 B2 | 11/2003 | Kumar et al. |
| 6,652,075 B2 | 11/2003 | Jacobson |
| 6,661,084 B1 | 12/2003 | Peterson et al. |
| 6,662,442 B1 | 12/2003 | Matsui et al. |
| 6,680,529 B2* | 1/2004 | Chen ............. H01L 23/49822 |
| | | 257/700 |
| 6,709,967 B2 | 3/2004 | Evers |
| 6,744,126 B1 | 6/2004 | Chiang |
| 6,750,473 B2 | 6/2004 | Amundson |
| 6,758,691 B1 | 7/2004 | McHugh |
| 6,773,302 B2 | 8/2004 | Gutierrez et al. |
| 6,800,169 B2 | 10/2004 | Liu et al. |
| 6,809,414 B1 | 10/2004 | Lin et al. |
| 6,821,131 B2 | 11/2004 | Suzuki et al. |
| 6,823,124 B1 | 11/2004 | Renn |
| 6,825,829 B1 | 11/2004 | Albert |
| 6,827,611 B1 | 12/2004 | Payne et al. |
| 6,830,460 B1 | 12/2004 | Rathburn |
| 6,840,777 B2 | 1/2005 | Sathe et al. |
| 6,853,087 B2 | 2/2005 | Neuhaus et al. |
| 6,856,151 B1 | 2/2005 | Cram |
| 6,861,345 B2 | 3/2005 | Ball et al. |
| 6,910,897 B2 | 6/2005 | Driscoll et al. |
| 6,946,325 B2 | 9/2005 | Yean et al. |
| 6,962,829 B2 | 11/2005 | Glenn et al. |
| 6,965,168 B2 | 11/2005 | Langhorn |
| 6,967,640 B2 | 11/2005 | Albert |
| 6,971,902 B2 | 12/2005 | Taylor |
| 6,987,661 B1 | 1/2006 | Huemoeller et al. |
| 6,992,376 B2 | 1/2006 | Jaeck |
| 7,009,413 B1 | 3/2006 | Alghouli |
| 7,025,600 B2 | 4/2006 | Higashi |
| 7,029,289 B2 | 4/2006 | Li |
| 7,040,902 B2 | 5/2006 | Li |
| 7,045,015 B2 | 5/2006 | Renn |
| 7,064,412 B2 | 6/2006 | Geissinger et al. |
| 7,070,419 B2 | 7/2006 | Brown et al. |
| 7,095,090 B2 | 8/2006 | Nakajiman et al. |
| 7,101,210 B2 | 9/2006 | Lin |
| 7,114,960 B2 | 10/2006 | Rathburn |
| 7,118,391 B2 | 10/2006 | Minich et al. |
| 7,121,837 B2 | 10/2006 | Sato et al. |
| 7,121,839 B2 | 10/2006 | Rathburn |
| 7,129,166 B2 | 10/2006 | Speakman |
| 7,138,328 B2 | 11/2006 | Downey et al. |
| 7,145,228 B2 | 12/2006 | Yean et al. |
| 7,148,128 B2 | 12/2006 | Jacobson |
| 7,154,175 B2 | 12/2006 | Shrivastava et al. |
| 7,157,799 B2 | 1/2007 | Noquil et al. |
| 7,180,313 B2 | 2/2007 | Bucksch |
| 7,217,996 B2 | 5/2007 | Cheng et al. |
| 7,220,287 B1 | 5/2007 | Wyrzykowska et al. |
| 7,229,293 B2 | 6/2007 | Sakurai et al. |
| 7,232,263 B2 | 6/2007 | Sashinaka et al. |
| 7,244,967 B2 | 7/2007 | Hundt et al. |
| 7,249,954 B2 | 7/2007 | Weiss |
| 7,276,919 B1 | 10/2007 | Beaman et al. |
| 7,301,105 B2 | 11/2007 | Vasoya |
| 7,321,168 B2 | 1/2008 | Tao |
| 7,326,064 B2 | 2/2008 | Rathburn |
| 7,327,006 B2 | 2/2008 | Svard et al. |
| 7,337,537 B1 | 3/2008 | Smetana, Jr. |
| 7,361,533 B1* | 4/2008 | Huemoeller ........ H01L 23/3128 |
| | | 257/666 |
| 7,382,363 B2 | 6/2008 | Albert et al. |
| 7,402,515 B2 | 7/2008 | Arana et al. |
| 7,410,825 B2 | 8/2008 | Majumdar et al. |
| 7,411,304 B2 | 8/2008 | Kirby et al. |
| 7,417,299 B2 | 8/2008 | Hu |
| 7,417,314 B1 | 8/2008 | Lin et al. |
| 7,423,219 B2 | 9/2008 | Kawaguchi et al. |
| 7,427,717 B2 | 9/2008 | Morimoto et al. |
| 7,432,600 B2 | 10/2008 | Klein et al. |
| 7,458,150 B2 | 12/2008 | Totokawa et al. |
| 7,459,393 B2 | 12/2008 | Farnworth et al. |
| 7,485,345 B2 | 2/2009 | Renn |
| 7,489,524 B2 | 2/2009 | Green et al. |
| 7,508,076 B2 | 3/2009 | Japp et al. |
| 7,527,502 B2 | 5/2009 | Li |
| 7,531,906 B2 | 5/2009 | Lee |
| 7,537,461 B2 | 5/2009 | Rathburn |
| 7,538,415 B1 | 5/2009 | Lin et al. |
| 7,563,645 B2 | 7/2009 | Jaeck |
| 7,595,454 B2 | 9/2009 | Kresge et al. |
| 7,619,309 B2 | 11/2009 | Drexl et al. |
| 7,621,761 B2 | 11/2009 | Mok et al. |
| 7,628,617 B2 | 12/2009 | Brown et al. |
| 7,632,106 B2 | 12/2009 | Nakamura |
| 7,645,635 B2 | 1/2010 | Wood et al. |
| 7,651,382 B2 | 1/2010 | Yasumura et al. |
| 7,658,163 B2 | 2/2010 | Renn |
| 7,674,671 B2 | 3/2010 | Renn |
| 7,726,984 B2 | 6/2010 | Bumb et al. |
| 7,736,152 B2 | 6/2010 | Hougham et al. |
| 7,748,110 B2 | 7/2010 | Asahi et al. |
| 7,758,351 B2 | 7/2010 | Brown et al. |
| 7,800,916 B2 | 9/2010 | Blackwell et al. |
| 7,833,832 B2 | 11/2010 | Wood et al. |
| 7,836,587 B2 | 11/2010 | Kim |
| 7,868,469 B2 | 1/2011 | Mizoguchi |
| 7,874,847 B2 | 1/2011 | Matsui et al. |
| 7,897,503 B2 | 3/2011 | Foster et al. |
| 7,898,087 B2 | 3/2011 | Chainer |
| 7,955,088 B2 | 6/2011 | Di Stefano |
| 7,999,369 B2 | 8/2011 | Malhan et al. |
| 8,044,502 B2 | 10/2011 | Rathburn |
| 8,058,558 B2 | 11/2011 | Mok et al. |
| 8,072,058 B2 | 12/2011 | Kim et al. |
| 8,114,687 B2 | 2/2012 | Mizoguchi |
| 8,120,173 B2 | 2/2012 | Forman et al. |

(56) References Cited

U.S. PATENT DOCUMENTS

| | | |
|---|---|---|
| 8,148,643 B2 | 4/2012 | Hirose et al. |
| 8,154,119 B2 | 4/2012 | Yoon et al. |
| 8,158,503 B2 | 4/2012 | Abe |
| 8,159,824 B2 | 4/2012 | Cho et al. |
| 8,178,978 B2 | 5/2012 | McElrea et al. |
| 8,203,207 B2 | 6/2012 | Getz et al. |
| 8,227,703 B2 | 7/2012 | Maruyama et al. |
| 8,232,632 B2 | 7/2012 | Rathburn |
| 8,247,702 B2 | 8/2012 | Kouya |
| 8,278,141 B2 | 10/2012 | Chow et al. |
| 8,299,494 B2 | 10/2012 | Yilmaz et al. |
| 8,329,581 B2 | 12/2012 | Haba et al. |
| 8,344,516 B2 | 1/2013 | Chainer |
| 8,373,428 B2 | 2/2013 | Eldridge et al. |
| 8,421,151 B2 | 4/2013 | Yamashita |
| 8,525,322 B1 | 9/2013 | Kim et al. |
| 8,525,346 B2 | 9/2013 | Rathburn |
| 8,536,714 B2 | 9/2013 | Sakaguchi |
| 8,536,889 B2 | 9/2013 | Nelson et al. |
| 8,610,265 B2 | 12/2013 | Rathburn |
| 8,618,649 B2 | 12/2013 | Rathburn |
| 8,789,272 B2 | 2/2014 | Rathburn |
| 8,758,067 B2 | 6/2014 | Rathburn |
| 8,803,539 B2 | 8/2014 | Rathburn |
| 8,829,671 B2 | 9/2014 | Rathburn |
| 8,912,812 B2 | 12/2014 | Rathburn |
| 8,928,344 B2 | 1/2015 | Rathburn |
| 8,955,215 B2 | 2/2015 | Rathburn |
| 8,955,216 B2 | 2/2015 | Rathburn |
| 8,970,031 B2 | 3/2015 | Rathburn |
| 8,981,568 B2 | 3/2015 | Rathburn |
| 8,981,809 B2 | 3/2015 | Rathburn |
| 8,984,748 B2 | 3/2015 | Rathburn |
| 8,987,886 B2 | 3/2015 | Rathburn |
| 8,988,093 B2 | 3/2015 | Rathburn |
| 2001/0012707 A1 | 8/2001 | Ho et al. |
| 2001/0016551 A1 | 8/2001 | Yishio et al. |
| 2002/0011639 A1 | 1/2002 | Carlson et al. |
| 2002/0027441 A1 | 3/2002 | Akrma et al. |
| 2002/0062200 A1 | 5/2002 | Mori et al. |
| 2002/0079912 A1 | 6/2002 | Shahriari et al. |
| 2002/0088116 A1 | 7/2002 | Milkovich et al. |
| 2002/0098740 A1 | 7/2002 | Ooya |
| 2002/0105080 A1 | 8/2002 | Speakman |
| 2002/0105087 A1 | 8/2002 | Forbes et al. |
| 2002/0157864 A1* | 10/2002 | Koyama ............ H05K 1/036 174/261 |
| 2002/0160103 A1 | 10/2002 | Fukunaga et al. |
| 2002/0172021 A1* | 11/2002 | Seri ............ H01L 23/49894 361/760 |
| 2003/0003779 A1 | 1/2003 | Rathburn |
| 2003/0096512 A1 | 5/2003 | Cornell |
| 2003/0114029 A1 | 6/2003 | Lee et al. |
| 2003/0117161 A1 | 6/2003 | Burns |
| 2003/0156400 A1 | 8/2003 | Dibene et al. |
| 2003/0162418 A1 | 8/2003 | Yamada |
| 2003/0164548 A1 | 9/2003 | Lee |
| 2003/0188890 A1 | 10/2003 | Bhatt et al. |
| 2003/0189083 A1 | 10/2003 | Olsen |
| 2003/0231819 A1 | 12/2003 | Palmer et al. |
| 2004/0016995 A1 | 1/2004 | Kuo et al. |
| 2004/0029411 A1 | 2/2004 | Rathburn |
| 2004/0048523 A1 | 3/2004 | Huang et al. |
| 2004/0054031 A1 | 3/2004 | Jacobson |
| 2004/0070042 A1 | 4/2004 | Lee et al. |
| 2004/0077190 A1 | 4/2004 | Huang et al. |
| 2004/0174180 A1 | 9/2004 | Fukushima et al. |
| 2004/0183557 A1 | 9/2004 | Akram |
| 2004/0184219 A1 | 9/2004 | Otsuka et al. |
| 2004/0217473 A1 | 11/2004 | Shen |
| 2004/0243348 A1 | 12/2004 | Minatani |
| 2005/0020116 A1 | 1/2005 | Kawazoe et al. |
| 2005/0048680 A1 | 3/2005 | Matsumani |
| 2005/0100294 A1 | 5/2005 | Nguyen et al. |
| 2005/0101164 A1 | 5/2005 | Rathburn |
| 2005/0155791 A1* | 7/2005 | Saiki ............ H01L 23/49822 174/262 |
| 2005/0162176 A1 | 7/2005 | Bucksch |
| 2005/0164527 A1 | 7/2005 | Radza et al. |
| 2005/0196511 A1 | 9/2005 | Garrity et al. |
| 2005/0253610 A1 | 11/2005 | Cram |
| 2006/0001152 A1* | 1/2006 | Hu ............ H01L 23/36 257/707 |
| 2006/0006534 A1 | 1/2006 | Yean et al. |
| 2006/0012966 A1 | 1/2006 | Chakravorty |
| 2006/0024924 A1 | 2/2006 | Haji et al. |
| 2006/0044357 A1 | 3/2006 | Andersen |
| 2006/0087064 A1 | 4/2006 | Daniel et al. |
| 2006/0125500 A1 | 6/2006 | Watkins et al. |
| 2006/0145338 A1 | 7/2006 | Dong |
| 2006/0149491 A1 | 7/2006 | Flach et al. |
| 2006/0157103 A1 | 7/2006 | Sheats et al. |
| 2006/0160379 A1 | 7/2006 | Rathburn |
| 2006/0186906 A1 | 8/2006 | Bottoms et al. |
| 2006/0208230 A1 | 9/2006 | Cho et al. |
| 2006/0265919 A1 | 10/2006 | Huang |
| 2006/0258912 A1 | 11/2006 | Belson et al. |
| 2006/0261827 A1 | 11/2006 | Cooper et al. |
| 2006/0281303 A1 | 12/2006 | Trezza et al. |
| 2007/0012475 A1* | 1/2007 | Kawaguchi ............ H05K 3/361 174/255 |
| 2007/0021002 A1 | 1/2007 | Laurx et al. |
| 2007/0035030 A1* | 2/2007 | Horton ............ H01L 23/49822 257/773 |
| 2007/0057382 A1 | 3/2007 | Liu et al. |
| 2007/0059901 A1 | 3/2007 | Majumdar et al. |
| 2007/0107933 A1* | 5/2007 | Yamamoto ........ H01L 23/49822 174/262 |
| 2007/0145981 A1 | 6/2007 | Tomita et al. |
| 2007/0148822 A1 | 6/2007 | Haba et al. |
| 2007/0169960 A1* | 7/2007 | Hayashi ............ H05K 3/4046 174/262 |
| 2007/0170595 A1 | 7/2007 | Sinha |
| 2007/0182431 A1 | 8/2007 | Komatsu et al. |
| 2007/0201209 A1 | 8/2007 | Francis et al. |
| 2007/0221404 A1 | 9/2007 | Das et al. |
| 2007/0224735 A1 | 9/2007 | Karashima et al. |
| 2007/0232059 A1 | 10/2007 | Abe |
| 2007/0259539 A1 | 11/2007 | Brown et al. |
| 2007/0263370 A1* | 11/2007 | Niki ............ H05K 1/115 361/783 |
| 2007/0267138 A1 | 11/2007 | White et al. |
| 2007/0269999 A1 | 11/2007 | Di Stefano |
| 2007/0273394 A1 | 11/2007 | Tanner et al. |
| 2007/0287304 A1 | 12/2007 | Eldridge |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0020624 A1 | 1/2008 | Nikaido et al. |
| 2008/0041822 A1 | 2/2008 | Wang |
| 2008/0057753 A1 | 3/2008 | Rathburn et al. |
| 2008/0060838 A1 | 3/2008 | Chen et al. |
| 2008/0073110 A1 | 3/2008 | Shioga et al. |
| 2008/0093115 A1 | 4/2008 | Lee |
| 2008/0107863 A1* | 5/2008 | Ikeda ............ H01L 21/4857 428/137 |
| 2008/0115961 A1 | 5/2008 | Mok et al. |
| 2008/0143358 A1 | 6/2008 | Breinlinger |
| 2008/0143367 A1 | 6/2008 | Chabineau-Lovgren |
| 2008/0156856 A1 | 7/2008 | Barausky et al. |
| 2008/0157361 A1 | 7/2008 | Wood et al. |
| 2008/0185180 A1 | 8/2008 | Cheng et al. |
| 2008/0197867 A1 | 8/2008 | Wokhlu et al. |
| 2008/0220584 A1 | 9/2008 | Kim et al. |
| 2008/0241997 A1* | 10/2008 | Sunohara ............ H01L 21/486 438/109 |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0264684 A1* | 10/2008 | Kang ............ H05K 3/205 174/262 |
| 2008/0265919 A1 | 10/2008 | Izadian |

(56) References Cited

U.S. PATENT DOCUMENTS

| | | |
|---|---|---|
| 2008/0290885 A1 | 11/2008 | Matsunami |
| 2008/0309349 A1 | 12/2008 | Sutono |
| 2009/0039496 A1 | 2/2009 | Beer et al. |
| 2009/0058444 A1 | 3/2009 | McIntyre |
| 2009/0061089 A1 | 3/2009 | King |
| 2009/0127698 A1 | 5/2009 | Rathburn |
| 2009/0133906 A1 | 5/2009 | Baek |
| 2009/0158581 A1 | 6/2009 | Nguyen et al. |
| 2009/0180236 A1 | 7/2009 | Lee et al. |
| 2009/0224404 A1 | 9/2009 | Wood et al. |
| 2009/0241332 A1* | 10/2009 | Lauffer .................. H05K 3/462 29/829 |
| 2009/0242262 A1* | 10/2009 | Asano .................. H05K 3/0064 174/267 |
| 2009/0267628 A1 | 10/2009 | Takase |
| 2009/0321915 A1 | 12/2009 | Hu et al. |
| 2010/0133680 A1 | 6/2010 | Kang et al. |
| 2010/0143194 A1 | 6/2010 | Lee et al. |
| 2010/0213960 A1 | 8/2010 | Mok et al. |
| 2010/0300734 A1 | 12/2010 | Ables et al. |
| 2011/0083881 A1 | 4/2011 | Nguyen et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061846 A1 | 3/2012 | Rathburn |
| 2012/0061851 A1 | 3/2012 | Rathburn |
| 2012/0062270 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0261166 A1* | 10/2012 | Oh ....................... H05K 1/0206 174/252 |
| 2012/0268155 A1 | 10/2012 | Rathburn |
| 2013/0078860 A1 | 3/2013 | Rathburn |
| 2013/0105984 A1 | 5/2013 | Rathburn |
| 2013/0203273 A1 | 8/2013 | Rathburn |
| 2013/0206468 A1 | 8/2013 | Rathburn |
| 2013/0210276 A1 | 8/2013 | Rathburn |
| 2013/0223034 A1 | 8/2013 | Rathburn |
| 2013/0244490 A1 | 9/2013 | Rathburn |
| 2013/0330942 A1 | 12/2013 | Rathburn |
| 2014/0043782 A1 | 2/2014 | Rathburn |
| 2014/0080258 A1 | 3/2014 | Rathburn |
| 2014/0192498 A1 | 7/2014 | Rathburn |
| 2014/0220797 A1 | 8/2014 | Rathburn |
| 2014/0225255 A1 | 8/2014 | Rathburn |
| 2014/0242816 A1 | 8/2014 | Rathburn |
| 2015/0013901 A1 | 1/2015 | Rathburn |
| 2015/0091600 A1 | 4/2015 | Rathburn |
| 2015/0136467 A1 | 5/2015 | Rathburn |
| 2015/0162678 A1 | 6/2015 | Rathburn |
| 2015/0181710 A1 | 6/2015 | Rathburn |

FOREIGN PATENT DOCUMENTS

| | | |
|---|---|---|
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO 2012/061008 | 5/2012 |
| WO | WO 2012/074963 | 6/2012 |
| WO | WO 2012/074969 | 6/2012 |
| WO | WO 2012/078493 | 6/2012 |
| WO | WO 2012/122142 | 9/2012 |
| WO | WO 2012/125331 | 9/2012 |
| WO | WO 2013/036565 | 3/2013 |
| WO | WO 2014/011226 | 1/2014 |
| WO | WO 2014/011228 | 1/2014 |
| WO | WO 2014/011232 | 1/2014 |
| WO | WO-2015/006393 | 1/2015 |

OTHER PUBLICATIONS

Notice of Allowance and Fee(s) Due dated Apr. 13, 2015 in co-pending U.S. Appl. No. 13/318,200, now published as US Patent Application Publication No. US 2012/0056332.

Notice of Allowance and Fee(s) Due dated May 18, 2015 in co-pending U.S. Appl. No. 14/086,029, now U.S. Pat. No. 9,076,884.

Final Office Action dated Jun. 30, 2015 in co-pending U.S. Appl. No. 13/318,369, now published as US Patent Application Publication No. US 2012/0043119.

Office Action dated Apr. 23, 2015 in co-pending U.S. Appl. No. 13/319,158, now published as US Patent Application Publication No. 2012/0051016.

Office Action dated Apr. 2, 2015 in co-pending U.S. Appl. No. 13/700,639, now published as US Patent Application Publication No. 2013/0078860.

Final Office Action dated Apr. 23, 2015 in co-pending U.S. Appl. No. 13/879,783, now published as US Patent Application Publication No. 2013/0223034.

Notice of Allowance and Fee(s) Due dated May 28, 2015 in co-pending U.S. Appl. No. 13/879,883, now published as US Patent Application Publication No. 2013/0244490.

Office Action dated May 22, 2015 in co-pending U.S. Appl. No. 13/880,231, now published as US Patent Application Publication No. 2013/0210276.

Office Action dated May 4, 2015 in co-pending U.S. Appl. No. 13/880,231, now published as US Patent Application Publication No. 2013/0210276.

Notice of Allowance and Fee(s) Due dated Jun. 4, 2015 in co-pending U.S. Appl. No. 13/410,914, now published as US Patent Application Publication No. US 2012/0164888.

Print—Definition of Print by The Free Dictionary, http://www.thefreedictionary.com/print, Aug. 13, 2014.

Amendment and Response Under Rule 1.1 16 filed Jul. 10, 2014 in co-pending U.S. Appl. No. 13/266,486, now published as US Patent Application Publication No. US 2012/0055701.

(56) References Cited

OTHER PUBLICATIONS

Advisory Action dated Jul. 21, 2014 in co-pending U.S. Appl. No. 13/266,486, now published as US Patent Application Publication No. US 2012/0055701.
Request for Continued Examination filed Jul. 31, 2014 in co-pending U.S. Appl. No. 13/266,486, now published as US Patent Application Publication No. US 2012/0055701.
Office Action dated Jul. 3, 2014 in co-pending U.S. Appl. No. 13/266,573, now published as US Patent Application Publication No. 2012/0061846.
Amendment and Response Under Rule 1.116 dated Jul. 10, 2014 in co-pending U.S. Appl. No. 13/266,907, now published as US Patent Application Publication No. US 2012/0268155.
Advisory Action dated Jul. 25, 2014 in co-pending U.S. Appl. No. 13/266,907, now published as US Patent Application Publication No. US 2012/0268155.
Advisory Action dated Aug. 8, 2014 in co-pending U.S. Appl. No. 13/266,907, now published as US Patent Application Publication No. US 2012/0268155.
Amendment and Response to Final Office Action and RCE filed Aug. 26, 2014 in co-pending U.S. Appl. No. 13/266,907, now published as US Patent Application Publication No. US 2012/0268155.
Final Office Action dated Aug. 1, 2014 in co-pending U.S. Appl. No. 13/318,038, now published as US Patent Application Publication No. US 2012/0062270.
Amendment and Response filed Jul. 27, 2014 in co-pending U.S. Appl. No. 13/318,181, now published as US Patent Application Publication No. US 2012/0044659.
Office Action dated Jul. 29, 2014 in co-pending U.S. Appl. No. 13/320,285, now published as US Patent Application Publication No. US 2012/0055702.
Final Office Action dated Jul. 31, 2014 in co-pending U.S. Appl. No. 13/319,120, now published as US Patent Application Publication No. US 2012/0055702.
Office Action dated Aug. 26, 2014 in co-pending U.S. Appl. No. 13/318,382, now published as US Patent Application Publication No. US 2012/0043130.
Final Office Action dated Aug. 4, 2014 in co-pending U.S. Appl. No. 13/319,145, now published as US Patent Application Publication No. 2012/0049342.
Amendment and Response filed Sep. 3, 2014 in co-pending U.S. Appl. No. 13/319,158, now published as US Patent Application Publication No. 2012/0051016.
Final Office Action dated Aug. 20, 2014 in co-pending U.S. Appl. No. 13/319,203, now published as US Patent Application Publication No. 2012/0056640.
Office Action dated Sep. 4, 2014 in co-pending U.S. Appl. No. 13/319,228, now published as US Patent Application Publication No. US 2012/0058653.
Amendment and Response filed Jul. 30, 2014 in co-pending U.S. Appl. No. 13/700,639, now published as US Patent Application Publication No. 2013/0078860.
Response to Restriction Requirement filed Jul. 17, 2014 in co-pending U.S. Appl. No. 13/879,783, now published as US Patent Application Publication No. 2013/0223034.
Amendment and Response Under Rule 1.116 filed Jul. 29, 2014 in co-pending U.S. Appl. No. 13/410,914, now published as US Patent Application Publication No. US 2012/0164888.
Advisory Action dated Aug. 12, 2014 in co-pending U.S. Appl. No. 13/410,914, now published as US Patent Application Publication No. US 2012/0164888.
Restriction Requirement dated Jul. 31, 2014 in co-pending U.S. Appl. No. 13/410,943, now published as US Patent Application Publication No. US 2012/0161317.
Response to Restriction Requirement filed Aug. 19, 2014 in co-pending U.S. Appl. No. 13/410,943, now published as US Patent Application Publication No. US 2012/0161317.

Amendment and Response filed Aug. 26, 2014 in co-pending U.S. Appl. No. 13/418,853, now published as US Patent Application Publication No. US 2012/0244728.
Co-pending U.S. Appl. No. 14/327,916 titled Matrix Defined Electrical Circuit Structure, filed Jul. 10, 2014.
Notice of Allowance and Fee(s) Due dated Nov. 24, 2014 in co-pending U.S. Appl. No. 13/266,486, now published as US Patent Application Publication No. US 2012/0055701.
Supplemental Notice of Allowance dated Dec. 24, 2014 in co-pending U.S. Appl. No. 13/266,486, now published as US Patent Application Publication No. US 2012/0055701.
Supplemental Notice of Allowance dated Dec. 19, 2014 in co-pending U.S. Appl. No. 13/318,181, now published as US Patent Application Publication No. US 2012/0044659.
Office Action dated Nov. 19, 2014 in co-pending U.S. Appl. No. 13/318,200, now published as US Patent Application Publication No. US 2012/0056332.
Office Action dated Nov. 14, 2014 in co-pending U.S. Appl. No. 13/318,369, now published as US Patent Application Publication No. US 2012/0043119.
Amendment and Response and Terminal Disclaimer filed Nov. 14, 2014 in co-pending U.S. Appl. No. 13/318,382, now published as US Patent Application Publication No. US 2012/0043130.
Notice of Allowance and Fee(s) Due dated Dec. 19, 2014 in co-pending U.S. Appl. No. 13/319,145 now published as US Patent Application Publication No. US 2012/0049342.
Amendment and Response Under Rule 1.116 and Request After Final Consideration Program 2.0 filed Dec. 18, 2014 in co-pending U.S. Appl. No. 13/319,158, now published as US Patent Application Publication No. 2012/0051016.
Advisory Action dated Jan. 2, 2015 in co-pending U.S. Appl. No. 13/319,158, now published as US Patent Application Publication No. 2012/0051016.
Request for Continued Examination filed Nov. 12, 2014 in co-pending U.S. Appl. No. 13/319,203, now published as US Patent Application Publication No. 2012/0056640.
Notice of Allowance and Fee(s) Due dated Dec. 10, 2014 in co-pending U.S. Appl. No. 13/319,203, now published as US Patent Application Publication No. 2012/0056640.
Amendment and Response and Terminal Disclaimer filed Nov. 17, 2014 in co-pending U.S. Appl. No. 13/319,228, now published as US Patent Application Publication No. US 2012/0058653.
Notice of Allowance and Fee(s) Due dated Jan. 13, 2015 in co-pending U.S. Appl. No. 13/319,228, now published as US Patent Application Publication No. US 2012/0058653.
Amendment and Response filed Nov. 19, 2014 in co-pending U.S. Appl. No. 13/643,436, now published as US Patent Application Publication No. 2013/0105984.
Response Under Rule 1.116 filed Nov. 11, 2014 in co-pending U.S. Appl. No. 13/700,639, now published as US Patent Application Publication No. 2013/0078860.
Amendment and Response and RCE filed Dec. 30, 2014 in co-pending U.S. Appl. No. 13/700,639, now published as US Patent Application Publication No. 2013/0078860.
Advisory Action dated Dec. 3, 2014 in co-pending U.S. Appl. No. 13/700,639, now published as US Patent Application Publication No. 2013/0078860.
Office Action dated Nov. 17, 2014 in co-pending U.S. Appl. No. 13/879,883, now published as US Patent Application Publication No. 2013/0244490.
Office Action dated Dec. 26, 2014 in co-pending U.S. Appl. No. 13/410,914, now published as US Patent Application Publication No. US 2012/0164888.
Restriction Requirement dated Nov. 19, 2014 in co-pending U.S. Appl. No. 13/413,032, now published as US Patent Application Publication No. US 2012/0182035.
Response to Restriction Requirement filed Nov. 20, 2014 in co-pending U.S. Appl. No. 13/413,032, now published as US Patent Application Publication No. US 2012/0182035.
Notice of Allowance and Fee(s) Due dated Jan. 5, 2015 in co-pending U.S. Appl. No. 13/413,032, now published as US Patent Application Publication No. US 2012/0182035.

(56) References Cited

OTHER PUBLICATIONS

Co-pending U.S. Appl. No. 14/408,205 titled Hybrid Printed Circuit Assembly With Low Density Main Core and Embedded High Density Circuit Regions, filed Dec. 15, 2014.
Co-pending U.S. Appl. No. 14/408,039 titled High Speed Circuit Assembly With Integral Terminal and Mating Bias Loading Electrical Connector Assembly, filed Dec. 15, 2014.
Co-pending U.S. Appl. No. 14/408,338 titled Semiconductor Socket With Direct Selective Metalization, filed Dec. 16, 2014.
Co-pending U.S. Appl. No. 14/565,724 titled Performance Enhanced Semiconductor Socket, filed Dec. 10, 2014.
U.S. Appl. No. 13/266,486, filed Oct. 27, 2011, 2012/0055701, now U.S. Pat. No. 8,955,215, High Performance Surface Mount Electrical Interconnect.
U.S. Appl. No. 14/621,663, filed Feb. 13, 2015, High Performance Surface Mount Electrical Interconnect.
U.S. Appl. No. 13/266,522, filed Oct. 27, 2011, 2012/0068727, now U.S. Pat. No. 8,803,539, Compliant Wafer Level Probe Assembly.
U.S. Appl. No. 13/266,573, filed Oct. 27, 2011, 2012/0061846, Compliant Printed Circuit Area Array Semiconductor Device Package.
U.S. Appl. No. 13/266,907, filed Oct. 28, 2011, 2012/0268155, now U.S. Pat. No. 8,928,344, Compliant Printed Circuit Socket Diagnostic Tool.
U.S. Appl. No. 13/318,038, filed Oct. 28, 2011, 2012/0062270, now U.S. Pat. No. 8,912,812, Compliant Printed Circuit Wafer Probe Diagnostic Tool.
U.S. Appl. No. 13/318,171, filed Oct. 31, 2011, 2012/0049877, now U.S. Pat. No. 8,789,272, Compliant Printed Circuit Peripheral Lead Semiconductor Test Socket.
U.S. Appl. No. 13/318,181, filed Oct. 31, 2011, 2012/0044659, now U.S. Pat. No. 8,955,216, Compliant Printed Circuit Peripheral Lead Semiconductor Package.
U.S. Appl. No. 13/318,200, filed Oct. 31, 2011, 2012/0056332, Compliant Printed Circuit Wafer Level Semiconductor Package.
U.S. Appl. No. 13/318,263, filed Oct. 31, 2011, 2012/0043667, now U.S. Pat. No. 8,618,649, Compliant Printed Circuit Semiconductor Package.
U.S. Appl. No. 14/086,029, filed Nov. 21, 2013, 2014/0080258, Compliant Printed Circuit Semiconductor Package.
U.S. Appl. No. 13/320,285, filed Nov. 14, 2011, 2012/005702, Compliant Printed Flexible Circuit.
U.S. Appl. No. 13/318,369, filed Nov. 1, 2011, 2012/0043119, Composite Polymer-Metal Electrical Contacts.
U.S. Appl. No. 13/318,382, filed Nov. 1, 2011, 2012/0043130, Resilient Conductive Electrical Interconnect.
U.S. Appl. No. 13/319,120, filed Nov. 7, 2011, 2012/0061851, now U.S. Pat. No. 8,981,568, Simulated Wirebond Semiconductor Package.
U.S. Appl. No. 13/319,145, filed Nov. 7, 2011, 2012/0049342, now U.S. Pat. No. 8,970,031, Semiconductor Die Terminal.
U.S. Appl. No. 13/319,158, filed Nov. 7, 2011, 2012/0051016, Semiconductor Socket.
U.S. Appl. No. 13/319,203, filed Nov. 7, 2011, 2012/0056640, now U.S. Pat. No. 8,981,809, Compliant Printed Circuit Semiconductor Tester Interface.
U.S. Appl. No. 13/319,228, filed Nov. 7, 2011, 2012/0058653, now U.S. Pat. No. 8,984,748, Singulated Semiconductor Device Separable Electrical Interconnect.
U.S. Appl. No. 13/575,368, filed Jul. 26, 2012, 2013/0203273, Abandoned, High Speed Backplane Connector.
U.S. Appl. No. 13/643,436, filed Oct. 25, 2012, 2013/0105984, Allowed, Semiconductor Device Package Adapter.
U.S. Appl. No. 13/700,639, filed Nov. 28, 2012, 2013/0078860, Electrical Connector Insulator Housing.
U.S. Appl. No. 13/879,783, filed Apr. 16, 2013, 2013/0223034, High Performance Electrical Circuit Structure.
U.S. Appl. No. 13/879,883, filed Apr. 17, 2013, 2013/0244490, High Performance Surface Mount Electrical Interconnect.
U.S. Appl. No. 13/880,231, filed Apr. 18, 2013, 2013/0210276, Electrical Interconnect IC Device Socket.
U.S. Appl. No. 13/880,461, filed Apr. 19, 2013, 2013/0206468, Electrical Interconnect IC Device Socket.
U.S. Appl. No. 13/410,914, filed Mar. 2, 2012, 2012/0164888, Metalized Pad to Electrical Contact Interface.
U.S. Appl. No. 13/410,943, filed Mar. 2, 2012, 2012/0161317, Area Array Semiconductor Device Package Interconnect Structure With Optional Package-To-Package or Flexible Circuit to Package Connection.
U.S. Appl. No. 13/412,870, filed Mar. 6, 2012, 2012/0171907, now U.S. Pat. No. 8,758,067, Selective Metalization of Electrical Connector or Socket Housing.
U.S. Appl. No. 14/271,801, filed May 7, 2014, 2014/0242816, Selective Metalization of Electrical Connector or Socket Housing.
U.S. Appl. No. 13/413,032, filed Mar. 6, 2012, 2012/0182035, now U.S. Pat. No. 8,988,093, Bumped Semiconductor Wafer or Die Level Electrical Interconnect.
U.S. Appl. No. 13/413,724, filed Mar. 7, 2012, 2012/0168948, now U.S. Pat. No. 8,987,886, Copper Pillar Full Metal Via Electrical Circuit Structure.
U.S. Appl. No. 14/255,083, filed Apr. 17, 2014, 2014/0225255, Copper Pillar Full Metal Via Electrical Circuit Structure.
U.S. Appl. No. 13/418,853, filed Mar. 13, 2012, 2012/0244728, High Performance Surface Mount Electrical Interconnect With External Biased Normal Force Loading.
U.S. Appl. No. 13/448,865, filed Apr. 17, 2012, 2012/0199985, now U.S. Pat. No. 8,610,265, Compliant Conductive Nano-Particle Electrical Interconnect.
U.S. Appl. No. 14/058,863, filed Oct. 21, 2013, 2014/0043782, now U.S. Pat. No. 8,829,671, Compliant Core Peripheral Lead Semiconductor Socket.
U.S. Appl. No. 13/448,914, filed Apr. 17, 2012, 2012/0202364, now U.S. Pat. No. 8,525,346, Compliant Core Peripheral Lead Semiconductor Test Socket.
U.S. Appl. No. 13/969,953, filed Aug. 19, 2013, 2013/0330942, now U.S. Pat. No. 8,704,377, Compliant Conductive Nano-Particle Electrical Interconnect.
U.S. Appl. No. 14/238,638, filed Feb. 12, 2014, 2014/0192498, Direct Metalization of Electrical Circuit Structure.
U.S. Appl. No. 14/408,205, filed Dec. 15, 2014, Hybrid Printed Circuit Assembly With Low Density Main Core and Embedded High Density Circuit Regions.
U.S. Appl. No. 14/408,039, filed Dec. 15, 2014, High Speed Circuit Assembly With Integral Terminal and Mating Bias Loading Electrical Connector Assembly.
U.S. Appl. No. 14/408,338, filed Dec. 16, 2014, Semiconductor Socket With Direct Selective Metalization.
U.S. Appl. No. 14/254,038, filed Apr. 16, 2014, 2014/0220797, High Performance Electrical Connector With Translated Insulator Contact Positioning.
U.S. Appl. No. 14/327,916, filed Jul. 10, 2014, 2015/0013901, Matrix Defined Electrical Circuit Structure.
U.S. Appl. No. 14/565,724, field Dec. 10, 2014, Performance Enhanced Semiconductor Socket.
Notification of Transmittal of the International Search Report and the Written Opinion of the International Searching Authority dated Jul. 30, 2010 in International Application No. PCT/US2010/036043.
Notification of Transmittal of the International Search Report and the Written Opinion of the International Searching Authority dated Jul. 21, 2010 in International Application No. PCT/US2010/036047.
Notification of Transmittal of the International Search Report and the Written Opinion of the International Searching Authority dated Jul. 28, 2010 in International Application No. PCT/US2010/036363.
Notification of Transmittal of the International Search Report and the Written Opinion of the International Searching Authority dated Jul. 28, 2010 in International Application No. PCT/US2010/036377.

(56) References Cited

OTHER PUBLICATIONS

Notification of Transmittal of the International Search Report and the Written Opinion of the International Searching Authority dated Jul. 30, 2010 in International Application No. PCT/US2010/036388.
Notification of Transmittal of the International Search Report and the Written Opinion of the International Searching Authority dated Jul. 27, 2010 in International Application No. PCT/US2010/036397.
Notification of Transmittal of the International Search Report and the Written Opinion of the International Searching Authority dated Jul. 30, 2010 in International Application No. PCT/US2010/036055.
Notification of Transmittal of the International Search Report and the Written Opinion of the International Searching Authority dated Aug. 4, 2010 in International Application No. PCT/US2010/036288.
Notification of Transmittal of the International Search Report and the Written Opinion of the International Searching Authority dated Aug. 4, 2010 in International Application No. PCT/US2010/036285.
Notification of Transmittal of the International Search Report and the Written Opinion of the International Searching Authority dated Jul. 30, 2010 in International Application No. PCT/US2010/036282.
Notification of Transmittal of the International Search Report and the Written Opinion of the International Searching Authority dated Jul. 30, 2010 in International Application No. PCT/US2010/036295.
Notification of Transmittal of the International Search Report and the Written Opinion of the International Searching Authority dated Jul. 30, 2010 in International Application No. PCT/US2010/036313.
Notification of Transmittal of the International Search Report and the Written Opinion of the International Searching Authority dated Aug. 3, 2010 in International Application No. PCT/US2010/037619.
Notification of Transmittal of the International Search Report and the Written Opinion of the International Searching Authority dated Sep. 7, 2010 in International Application No. PCT/US2010/038600.
Notification of Transmittal of the International Search Report and the Written Opinion of the International Searching Authority dated Aug. 18, 2010 in International Application No. PCT/US2010/038606.
Notification of Transmittal of the International Search Report and the Written Opinion of the International Searching Authority dated Sep. 1, 2010 in International Application No. PCT/US2010/040188.
Notification of Transmittal of the International Search Report and the Written Opinion of the International Searching Authority dated Aug. 20, 2010 in International Application No. PCT/US2010/040197.
Notification of Transmittal of the International Search Report and the Written Opinion of the International Searching Authority dated Apr. 14, 2011 in International Application No. PCT/US2011/023138.
Notification of Transmittal of the International Search Report and the Written Opinion of the International Searching Authority dated Aug. 17, 2011 in International Application No. PCT/US2011/033726.
Notification of Transmittal of the International Search Report and the Written Opinion of the International Searching Authority dated Sep. 27, 2011 in International Application No. PCT/US2011/038845.
Notification of Transmittal of the International Search Report and the Written Opinion of the International Searching Authority dated Feb. 8, 2012 in International Application No. PCT/US2011/056664.
Notification of Transmittal of the International Search Report and the Written Opinion of the International Searching Authority dated Mar. 26, 2012 in International Application No. PCT/US2011/062313.
Notification of Transmittal of the International Search Report and the Written Opinion of the International Searching Authority dated Jun. 20, 2012 in International Application No. PCT/US2012/027813.
Notification of Transmittal of the International Search Report and the Written Opinion of the International Searching Authority dated Jun. 19, 2012 in International Application No. PCT/US2012/027823.
Notification of Transmittal of the International Search Report and the Written Opinion of the International searching Authority dated Nov. 29, 2012 in International Application No. PCT/US2012/053848.
Notification of Transmittal of the International Search Report and the Written Opinion of the International Searching Authority dated Jun. 3, 2013 in International Application No. PCT/US2013/031395.
Notification of Transmittal of the International Search Report and the Written Opinion of the International Searching Authority dated Jun. 19, 2013 in International Application No. PCT/US2013/030981.
Notification of Transmittal of the International Search Report and the Written Opinion of the International Searching Authority dated Jun. 7, 2013 in International Application No. PCT/US2013/030856.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PC8007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Liu, et al, "All-Polymer Capacitor Fabricated with Inkjet Printing Technique," Solid-State Electronics, vol. 47, pp. 1543-1548 (2003).
Restriction Requirement dated Jun. 13, 2013 in co-pending U.S. Appl. No. 13/266,486, now published as US Patent Application Publication No. US 2012/0055701.
Response to Restriction Requirement filed Jul. 15, 2013 in co-pending U.S. Appl. No. 13/266,486, now published as US Patent Application Publication No. US 2012/0055701.
Restriction Requirement dated Sep. 25, 2013 in co-pending U.S. Appl. No. 13/266,486, now published as US Patent Application Publication No. US 2012/0055701.
Response to Restriction Requirement filed Oct. 2, 2013 in co-pending U.S. Appl. No. 13/266,486, now published as US Patent Application Publication No. US 2012/0055701.
Office Action dated Oct. 30, 2013 in co-pending U.S. Appl. No. 13/266,486, now published as US Patent Application Publication No. US 2012/0055701.
Amendment and Response filed Nov. 6, 2013 in co-pending U.S. Appl. No. 13/266,486, now published as US Patent Application Publication No. US 2012/0055701.
Notice of Non-Compliant Amended dated Nov. 15, 2013 in co-pending U.S. Appl. No. 13/266,486, now published as US Patent Application Publication No. US 2012/0055701.
Response and Examiner's Interview Summary filed Nov. 20, 2013 in co-pending U.S. Appl. No. 13/266,486, now published as US Patent Application Publication No. US 2012/0055701.
Final Office Action dated May 15, 2014 in co-pending U.S. Appl. No. 13/266,486, now published as US Patent Application Publication No. US 2012/0055701.
Notice of Allowance and Fee(s) Due dated May 2, 2014 in co-pending U.S. Appl. No. 13/266,522, now U.S. Pat. No. 8,803,539.
Restriction Requirement dated Oct. 1, 2013 in co-pending U.S. Appl. No. 13/319,145, now published as US Patent Application Publication No. 2012/0049342.
Response to Restriction Requirement filed Oct. 4, 2013 in co-pending U.S. Appl. No. 13/319,145, now published as US Patent Application Publication No. 2012/0049342.

(56) References Cited

OTHER PUBLICATIONS

Office Action dated Dec. 26, 2013 in co-pending U.S. Appl. No. 13/319,145, now published as US Patent Application Publication No. 2012/0049342.
Amendment and Response filed Mar. 18, 2014 in co-pending U.S. Appl. No. 13/319,145, now published as US Patent Application Publication No. 2012/0049342.
Office Action dated Nov. 22, 2013 in co-pending U.S. Appl. No. 13/266,907, now published as US Patent Application Publication No. US 2012/0268155.
Amendment and Response filed Jan. 3, 2014 in co-pending U.S. Appl. No. 13/266,907, now published as US Patent Application Publication No. US 2012/0268155.
Supplemental Amendment and Response filed Jan. 29, 2014 in co-pending U.S. Appl. No. 13/266,907, now published as US Patent Application Publication No. US 2012/0268155.
Final Office Action dated May 7, 2014 in co-pending U.S. Appl. No. 13/266,907, now published as US Patent Application Publication No. US 2012/0268155.
Office Action dated Jan. 3, 2014 in co-pending U.S. Appl. No. 13/318,038, now published as US Patent Application Publication No. US 2012/0062270.
Amendment and Response and Terminal Disclaimer filed Apr. 2, 2014 in co-pending U.S. Appl. No. 13/318,038, now published as US Patent Application Publication No. US 2012/0062270.
Terminal Disclaimer Review Decision dated Apr. 2, 2014 in co-pending U.S. Appl. No. 13/318,038, now published as US Patent Application Publication No. US 2012/0062270.
Restriction Requirement dated Dec. 9, 2013 in co-pending U.S. Appl. No. 13/318,171, now U.S. Pat. No. 8,789,272.
Response to Restriction Requirement filed Dec. 17, 2013 in co-pending U.S. Appl. No. 13/318,171, now U.S. Pat. No. 8,789,272.
Office Action dated Feb. 14, 2014 in co-pending U.S. Appl. No. 13/318,171, now U.S. Pat. No. 8,789,272.
Amendment and Response filed Feb. 26, 2014 in co-pending U.S. Appl. No. 13/318,171, now U.S. Pat. No. 8,789,272.
Notice of Allowance and Fee(s) Due dated Mar. 14, 2014 in co-pending U.S. Appl. No. 13/318,171, now U.S. Pat. No. 8,789,272.
Restriction Requirement dated Dec. 9, 2013 in co-pending U.S. Appl. No. 13/318,181, now published as US Patent Application Publication No. US 2012/0044659.
Response to Restriction Requirement filed Jan. 28, 2014 in co-pending U.S. Appl. No. 13/318,181, now published as US Patent Application Publication No. US 2012/0044659.
Office Action dated Apr. 21, 2014 in co-pending U.S. Appl. No. 13/318,181, now published as US Patent Application Publication No. US 2012/0044659.
Restriction Requirement dated Mar. 1, 2013 in co-pending U.S. Appl. No. 13/318,200, now published as US Patent Application Publication No. US 2012/0056332.
Response to Restriction Requirement filed Mar. 7, 2013 in co-pending U.S. Appl. No. 13/318,200, now published as US Patent Application Publication No. US 2012/0056332.
Office Communication dated May 30, 2013 in co-pending U.S. Appl. No. 13/318,200, now published as US Patent Application Publication No. US 2012/0056332.
Office Action dated May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Final Office Action dated Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.
Advisory Action dated Dec. 6, 2013 in co-pending U.S. Appl. No. 13/318,200, now published as US Patent Application Publication No. US 2012/0056332.
Response to Advisory Action filed Dec. 6, 2013 in co-pending U.S. Appl. No. 13/318,200, now published as US Patent Application Publication No. US 2012/0056332.
Request for Continued Examination filed Feb. 11, 2014 in co-pending U.S. Appl. No. 13/318,200, now published as US Patent Application Publication No. US 2012/0056332.
Office Action dated Nov. 23, 2012 in co-pending U.S. Appl. No. 13/318,263, now published as US Patent Application Publication No. US 2012/0043667.
Amendment and Response filed Mar. 4, 2013 in co-pending U.S. Appl. No. 13/318,263, now published as US Patent Application Publication No. US 2012/0043667.
Office Action dated Jul. 10, 2013 in co-pending U.S. Appl. No. 13/318,263, now published as US Patent Application Publication No. US 2012/0043667.
Amendment and Response filed Sep. 24, 2013 in co-pending U.S. Appl. No. 13/318,263, now published as US Patent Application Publication No. US 2012/0043667.
Notice of Allowance dated Oct. 28, 2013 in co-pending U.S. Appl. No. 13/318,263, now published as US Patent Application Publication No. US 2012/0043667.
Office Action dated Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Final Office Action dated Jan. 8, 2014 in co-pending U.S. Appl. No. 13/320,285, now published as US Patent Application Publication No. US 2012/0055702.
Amendment and Response to Final Office filed Feb. 18, 2014 in co-pending U.S. Appl. No. 13/320,285, now published as US Patent Application Publication No. US 2012/0055702.
Advisory Action dated Feb. 26, 2014 in co-pending U.S. Appl. No. 13/320,285, now published as US Patent Application Publication No. US 2012/0055702.
RCE filed Mar. 10, 2014 in co-pending U.S. Appl. No. 13/320,285, now published as US Patent Application Publication No. US 2012/0055702.
Restriction Requirement dated Sep. 26, 2013 in co-pending U.S. Appl. No. 13/319,120 now published as US Patent Application Publication No. US 2012/0061851.
Response to Restriction Requirement filed Oct. 8, 2013 in co-pending U.S. Appl. No. 13/319,120 now published as US Patent Application Publication No. US 2012/0061851.
Notice of Non-Compliant Amendment dated Oct. 15, 2013 in co-pending U.S. Appl. No. 13/319,120 now published as US Patent Application Publication No. US 2012/0061851.
Response to Restriction Requirement filed Oct. 18, 2013 in co-pending U.S. Appl. No. 13/319,120 now published as US Patent Application Publication No. US 2012/0061851.
Office Action dated Jan. 17, 2014 in co-pending U.S. Appl. No. 13/319,120 now published as US Patent Application Publication No. US 2012/0061851.
Amendment and Response filed Apr. 16, 2014 in co-pending U.S. Appl. No. 13/319,120 now published as US Patent Application Publication No. US 2012/0061851.
Final Office Action dated Jul. 31, 2014 in co-pending U.S. Appl. No. 13/319,120 now published as US Patent Application Publication No. US 2012/0061851.
Restriction Requirement dated Jan. 30, 2014 in co-pending U.S. Appl. No. 13/319,158, now published as US Patent Application Publication No. 2012/0051016.
Response to Restriction Requirement filed Feb. 6, 2014 in co-pending U.S. Appl. No. 13/319,158, now published as US Patent Application Publication No. 2012/0051016.
Office Action dated Jun. 27, 2014 in co-pending U.S. Appl. No. 13/319,158, now published as US Patent Application Publication No. 2012/0051016.

(56) References Cited

OTHER PUBLICATIONS

Office Action dated Feb. 27, 2014 in co-pending U.S. Appl. No. 13/319,203, now published as US Patent Application Publication No. 2012/0056640.
Amendment and Response filed Jun. 10, 2014 in co-pending U.S. Appl. No. 13/319,203, now published as US Patent Application Publication No. 2012/0056640.
Response to Restriction Requirement filed Oct. 4, 2013 in co-pending U.S. Appl. No. 13/266,573, now published as US Patent Application Publication No. 2012/0061846.
Office Action dated Feb. 21, 2014 in co-pending U.S. Appl. No. 13/266,573, now published as US Patent Application Publication No. 2012/0061846.
Amendment and Response filed Feb. 26, 2014 in co-pending U.S. Appl. No. 13/266,573, now published as US Patent Application Publication No. 2012/0061846.
Examiner-Initiated Interview Summary dated Mar. 14, 2013 in co-pending U.S. Appl. No. 13/319,228, now published as US Patent Application Publication No. US 2012/0058653.
Restriction Requirement dated Apr. 23, 2014 in co-pending U.S. Appl. No. 13/319,228, now published as US Patent Application Publication No. US 2012/0058653.
Response to Restriction Requirement filed Jun. 23, 2014 in co-pending U.S. Appl. No. 13/319,228, now published as US Patent Application Publication No. US 2012/0058653.
Restriction Requirement dated Feb. 7, 2014 in co-pending U.S. Appl. No. 13/575,368, now published as US Patent Application Publication No. 2013/0203273.
Response to Restriction Requirement filed Feb. 19, 2014 in co-pending U.S. Appl. No. 13/575,368, now published as US Patent Application Publication No. 2013/0203273.
Office Action dated Mar. 4, 2014 in co-pending U.S. Appl. No. 13/575,368, now published as US Patent Application Publication No. 2013/0203273.
Office Action dated Apr. 24, 2014 in co-pending U.S. Appl. No. 13/700,639, now published as US Patent Application Publication No. 2013/0078860.
Restriction Requirement dated Jun. 5, 2014 in co-pending U.S. Appl. No. 13/879,783, now published as US Patent Application Publication No. 2013/0223034.
Restriction Requirement dated Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action dated Dec. 16, 2013 in co-pending U.S. Appl. No. 13/410,914, now published as US Patent Application Publication No. US 2012/0164888.
Amendment and Response filed Mar. 17, 2014 in co-pending U.S. Appl. No. 13/410,914, now published as US Patent Application Publication No. US 2012/0164888.
Final Office Action dated Jun. 4, 2014 in co-pending U.S. Appl. No. 13/410,914, now published as US Patent Application Publication No. US 2012/0164888.
Office Action dated Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Notice of Allowance and Fee(s) Due dated Feb. 26, 2014 in co-pending U.S. Appl. No. 13/412,870, now published as US Patent Application Publication No. US 2012/0171907.
Office Action dated Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment dated May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action dated Sep. 16, 2013 in co-pending U.S. Appl. No. 13/413,724, now published as US Patent Application Publication No. US 2012/0168948.
Amendment and Response filed Nov. 20, 2013 in co-pending U.S. Appl. No. 13/413,724, now published as US Patent Application Publication No. US 2012/0168948.
Final Office Action dated Feb. 14, 2014 in co-pending U.S. Appl. No. 13/413,724, now published as US Patent Application Publication No. US 2012/0168948.
Amendment and Response to Final Office filed Feb. 26, 2014 in co-pending U.S. Appl. No. 13/413,724, now published as US Patent Application Publication No. US 2012/0168948.
Advisory Action dated Mar. 28, 2014 in co-pending U.S. Appl. No. 13/413,724, now published as US Patent Application Publication No. US 2012/0168948.
Second Amendment and Response filed Apr. 14, 2014 in co-pending U.S. Appl. No. 13/413,724, now published as US Patent Application Publication No. US 2012/0168948.
Notice of Allowance and Fee(s) Due dated May 9, 2014 in co-pending U.S. Appl. No. 13/413,724, now published as US Patent Application Publication No. US 2012/0168948.
Restriction Requirement dated Apr. 10, 2014 in co-pending U.S. Appl. No. 13/418,853, now published as US Patent Application Publication No. US 2012/0244728.
Response to Restriction Requirement filed Apr. 23, 2014 in co-pending U.S. Appl. No. 13/418,853, now published as US Patent Application Publication No. US 2012/0244728.
Office Action dated Jun. 26, 2014 in co-pending U.S. Appl. No. 13/418,853, now published as US Patent Application Publication No. US 2012/0244728.
Notice of Allowance and Fee(s) Due dated Oct. 2, 2013 in co-pending U.S. Appl. No. 13/448,865, now published as US Patent Application Publication No. US 2012/0199985.
Notice of Allowance and Fee(s) Due dated Dec. 6, 2013 in co-pending U.S. Appl. No. 14/058,863, now published as US Patent Application Publication No. 2014/0043782.
Office Action dated Mar. 20, 2014 in co-pending U.S. Appl. No. 14/058,863, now published as US Patent Application Publication No. 2014/0043782.
Office Action dated Mar. 27, 2014 in co-pending U.S. Appl. No. 14/058,863, now published as US Patent Application Publication No. 2014/0043782.
Response and Terminal Disclaimer filed Apr. 2, 2014 in co-pending U.S. Appl. No. 14/058,863, now published as US Patent Application Publication No. 2014/0043782.
Notice of Allowance and Fee(s) Due dated Apr. 17, 2014 in co-pending U.S. Appl. No. 14/058,863, now published as US Patent Application Publication No. 2014/0043782.
Office Action dated May 9, 2013 in co-pending U.S. Appl. No. 13/448,914, now published as US Patent Application Publication No. US 2012/0202364.
Amendment and Response filed May 20, 2013 in co-pending U.S. Appl. No. 13/448,914, now published as US Patent Application Publication No. US 2012/0202364.
Notice of Allowance and Fee(s) Due dated Jul. 28, 2013 in co-pending U.S. Appl. No. 13/448,914, now published as US Patent Application Publication No. US 2012/0202364.
Office Action dated Oct. 7, 2013 in co-pending U.S. Appl. No. 13/969,953, now U.S. Pat. No. 8,704,377.
Amendment and Response and Terminal Disclaimer filed Nov. 20, 2013 in co-pending U.S. Appl. No. 13/969,953, now U.S. Pat. No. 8,704,377.
Final Office Action dated Dec. 20, 2013 in co-pending U.S. Appl. No. 13/969,953, now U.S. Pat. No. 8,704,377.

(56) References Cited

OTHER PUBLICATIONS

Amendment and Response to Final Office filed Dec. 30, 2013 in co-pending U.S. Appl. No. 13/969,953, now U.S. Pat. No. 8,704,377.
Notice of Allowance and Fee(s) Due dated Jan. 22, 2014 in co-pending U.S. Appl. No. 13/969,953, now U.S. Pat. No. 8,704,377.
Notification of Transmittal of the International Search Report and the Written Opinion of the International Searching Authority dated Oct. 27, 2014 in International Application No. PCT/US2014/045856.
*Ex Parte Quayle* Action mailed Oct. 1, 2014 in co-pending U.S. Appl. No. 13/266,486, now published as US Patent Application Publication No. US 2012/0055701.
Amendment and Response After *ExParte Quayle* Action filed Oct. 6, 2014 in co-pending U.S. Appl. No. 13/266,486, now published as US Patent Application Publication No. US 2012/0055701.
Notice of Non-Compliant Amendment dated Oct. 14, 2014 in co-pending U.S. Appl. No. 13/266,486, now published as US Patent Application Publication No. US 2012/0055701.
Corrected Amendment and Response filed Oct. 15, 2014 in co-pending U.S. Appl. No. 13/266,486, now published as US Patent Application Publication No. US 2012/0055701.
Amendment and Response filed Sep. 9, 2014 in co-pending U.S. Appl. No. 13/266,573, now published as US Patent Application Publication No. 2012/0061846.
Notice of Allowance and Fee(s) Due dated Oct. 8, 2014 in co-pending U.S. Appl. No. 13/266,907, now published as US Patent Application Publication No. US 2012/0268155.
Amendment and Response Under Rule 1.116 and Termination Disclaimer filed Sep. 4, 2014 in co-pending U.S. Appl. No. 13/318,038, now published as US Patent Application Publication No. US 2012/0062270.
Terminal Disclaimer Review Decision dated Sep. 8, 2014 in co-pending U.S. Appl. No. 13/318,038, now published as US Patent Application Publication No. US 2012/0062270.
Notice of Allowance and Fee(s) Due dated Sep. 30, 2014 in co-pending U.S. Appl. No. 13/318,038, now published as US Patent Application Publication No. US 2012/0062270.
Notice of Allowance and Fee(s) Due dated Oct. 24, 2014 in co-pending U.S. Appl. No. 13/318,181, now published as US Patent Application Publication No. US 2012/0044659.
Amendment and Response and Examiner's Interview Summary filed Oct. 15, 2014 in co-pending U.S. Appl. No. 13/320,285, now published as US Patent Application Publication No. US 2012/0055702.
Restriction Requirement dated Sep. 8, 2014 in co-pending U.S. Appl. No. 13/318,369, now published as US Patent Application Publication No. US 2012/0043119.
Response to Restriction Requirement filed Oct. 13, 2014 in co-pending U.S. Appl. No. 13/318,369, now published as US Patent Application Publication No. US 2012/0043119.
Applicant-Initiated Interview Summary dated Sep. 12, 2014 in co-pending U.S. Appl. No. 13/319,120 now published as US Patent Application Publication No. US 2012/0061851.
Amendment and Response and RCE filed Oct. 1, 2014 in co-pending U.S. Appl. No. 13/319,120 now published as US Patent Application Publication No. US 2012/0061851.
Notice of Allowance and Fee(s) Due dated Oct. 27, 2014 in co-pending U.S. Appl. No. 13/319,120 now published as US Patent Application Publication No. US 2012/0061851.
Applicant-Initiated Interview Summary dated Sep. 12, 2014 in co-pending U.S. Appl. No. 13/319,145 now published as US Patent Application Publication No. US 2012/0049342.
Amendment and Response Under Rule 1.116 filed Sep. 18, 2014 in co-pending U.S. Appl. No. 13/319,145 now published as US Patent Application Publication No. US 2012/0049342.
Final Office Action dated Nov. 6, 2014 in co-pending U.S. Appl. No. 13/319,158, now published as US Patent Application Publication No. 2012/0051016.

Amendment and Response Under Rule 1.116 filed Oct. 2, 2014 in co-pending U.S. Appl. No. 13/319,203, now published as US Patent Application Publication No. 2012/0056640.
Applicant-Initiated Interview Summary dated Oct. 9, 2014 in co-pending U.S. Appl. No. 13/319,203, now published as US Patent Application Publication No. 2012/0056640.
Advisory Action dated Oct. 16, 2014 in co-pending U.S. Appl. No. 13/319,203, now published as US Patent Application Publication No. 2012/0056640.
Notice of Abandonment dated Oct. 10, 2014 in co-pending U.S. Appl. No. 13/575,368, now published as US Patent Application Publication No. 2013/0203273.
Office Action dated Sep. 17, 2014 in co-pending U.S. Appl. No. 13/643,436, now published as US Patent Application Publication No. 2013/0105984.
Final Office Action dated Sep. 8, 2014 in co-pending U.S. Appl. No. 13/700,639, now published as US Patent Application Publication No. 2013/0078860.
Office Action dated Oct. 6, 2014 in co-pending U.S. Appl. No. 13/879,783, now published as US Patent Application Publication No. 2013/0223034.
Amendment and Response and RCE filed Sep. 30, 2014 in co-pending U.S. Appl. No. 13/410,914, now published as US Patent Application Publication No. US 2012/0164888.
Final Office Action dated Oct. 28, 2014 in co-pending U.S. Appl. No. 13/418,853, now published as US Patent Application Publication No. US 2012/0244728.
Final Office Action dated Mar. 16, 2015 in co-pending U.S. Appl. No. 13/320,285, now published as US Patent Application Publication No. US 2012/0055702.
Final Office Action dated Feb. 10, 2015 in co-pending U.S. Appl. No. 13/318,382, now published as US Patent Application Publication No. US 2012/0043130.
Amendment and Response with RCE filed Feb. 5, 2015 in co-pending U.S. Appl. No. 15/319,158, now published as US Patent Application Publication No. 2012/0051016.
Notice of Allowance and Fee(s) Due dated Feb. 9, 2015 in co-pending U.S. Appl. No. 13/643,436, now published as US Patent Application Publication No. 2013/0105984.
Restriction Requirement dated Feb. 12, 2015 in co-pending U.S. Appl. No. 13/700,639, now published as US Patent Application Publication No. 2013/0078860.
Response to Restriction Requirement filed Feb. 24, 2015 in co-pending U.S. Appl. No. 13/700,639, now published as US Patent Application Publication No. 2013/0078860.
Amendment and Response filed Feb. 3, 2015 in co-pending U.S. Appl. No. 13/879,783, now published as US Patent Application Publication No. 2013/0223034.
Amendment and Response filed Mar. 10, 2015 in co-pending U.S. Appl. No. 13/879,883, now published as US Patent Application Publication No. 2013/0244490.
Restriction Requirement dated Jan. 22, 2015 in co-pending U.S. Appl. No. 13/880,231, now published as US Patent Application Publication No. 2013/0210276.
Response to Restriction Requirement filed Jan. 27, 2015 in co-pending U.S. Appl. No. 13/880,231, now published as US Patent Application Publication No. 2013/0210276.
Office Action dated Feb. 27, 2015 in co-pending U.S. Appl. No. 13/410,943, now published as US Patent Application Publication No. US 2012/0161317.
Amendment and Response with RCE filed Jan. 28, 2015 in co-pending U.S. Appl. No. 13/418,853, now published as US Patent Application Publication No. US 2012/0244728.
Office Action dated Feb. 20, 2015 in co-pending U.S. Appl. No. 13/418,853, now published as US Patent Application Publication No. US 2012/0244728.
Co-pending U.S. Appl. No. 14/621,663 titled High Performance Surface Mount Electrical Interconnect, filed Feb. 13, 2015.

\* cited by examiner

COPPER PILLAR FULL METAL VIA ELECTRICAL CIRCUIT STRUCTURE

CROSS-REFERENCE TO RELATED APPLICATIONS

This application is a continuation-in-part of U.S. patent application Ser. No. 13/413,724 entitled Copper Pillar Full Metal Via Electrical Circuit Structure, filed Mar. 7, 2012, which claims the benefit of U.S. Provisional Application No. 61/451,685, filed Mar. 11, 2011, the disclosure of which is hereby incorporated by reference.

This application is a continuation-in-part of U.S. patent application Ser. No. 13/266,573, titled COMPLIANT PRINTED CIRCUIT AREA ARRAY SEMICONDUCTOR DEVICE PACKAGE, filed Oct. 27, 2011, which is a national stage application under 35 U.S.C. § 371 of International Application No. PCT/US2010/036363, titled COMPLIANT PRINTED CIRCUIT AREA ARRAY SEMICONDUCTOR DEVICE PACKAGE, filed May 27, 2010, which claims priority to U.S. Provisional Application No. 61/183,411, filed Jun. 2, 2009, all of which are hereby incorporated by reference in their entireties.

This application is a continuation-in-part of U.S. patent application Ser. No. 13/318,181, titled COMPLIANT PRINTED CIRCUIT PERIPHERAL LEAD SEMICONDUCTOR PACKAGE, filed Oct. 31, 2011, which is a national stage application under 35 U.S.C. § 371 of International Application No. PCT/US2010/036055, titled COMPLIANT PRINTED CIRCUIT PERIPHERAL LEAD SEMICONDUCTOR PACKAGE, filed May 25, 2010, which claims priority to U.S. Provisional Application No. 61/183,365, filed Jun. 2, 2009, all of which are hereby incorporated by reference in their entireties.

This application is a continuation-in-part of U.S. patent application Ser. No. 13/318,200, title COMPLIANT PRINTED CIRCUIT WAFER LEVEL SEMICONDUCTOR PACKAGE, filed Oct. 31, 2011, which is a national stage application under 35 U.S.C. § 371 of International Application No. PCT/US2010/036288, titled COMPLIANT PRINTED CIRCUIT WAFER LEVEL SEMICONDUCTOR PACKAGE, filed May 27, 2010, which claims priority to U.S. Provisional Application No. 61/183,356, filed Jun. 2, 2009, all of which are hereby incorporated by reference in their entireties.

This application is a continuation-in-part of U.S. patent application Ser. No. 13/318,382, entitled RESILIENT CONDUCTIVE ELECTRICAL INTERCONNECT, filed Nov. 1, 2011, which is a national stage application under 35 U.S.C. § 371 of International Application No. PCT/US2010/036313, titled RESILIENT CONDUCTIVE ELECTRICAL INTERCONNECT, filed May 27, 2010, which claims priority to U.S. Provisional Application No. 61/183,335, filed Jun. 2, 2009, all of which are hereby incorporated by reference in their entireties.

This application is a continuation-in-part of U.S. patent application Ser. No. 13/319,203, entitled COMPLIANT PRINTED CIRCUIT SEMICONDUCTOR TESTER INTERFACE, filed Nov. 7, 2011, which is a national stage application under 35 U.S.C. § 371 of International Application No. PCT/US2010/040188, titled COMPLIANT PRINTED CIRCUIT SEMICONDUCTOR TESTER INTERFACE, filed Jun. 28, 2010, which claims priority to U.S. Provisional Application No. 61/221,356, filed Jun. 29, 2009, all of which are hereby incorporated by reference in their entireties.

TECHNICAL FIELD

The present disclosure relates to a high performance electrical interconnect for electrically coupling least two circuit members using a unique fabrication technique that merges processes used in the printed circuit and semiconductor packaging industries with the flexibility of additive printing technology.

BACKGROUND OF THE INVENTION

Traditional printed circuits are often constructed in what is commonly called rigid or flexible formats. The rigid versions are used in nearly every electronic system, where the printed circuit board (PCB) is essentially a laminate of materials and circuits that when built is relatively stiff or rigid and cannot be bent significantly without damage.

Flexible circuits have become very popular in many applications where the ability to bend the circuit to connect one member of a system to another has some benefit. These flexible circuits are made in a very similar fashion as rigid PCB's, where layers of circuitry and dielectric materials are laminated. The main difference is the material set used for construction. Typical flexible circuits start with a polymer film that is clad, laminated, or deposited with copper. A photolithography image with the desired circuitry geometry is printed onto the copper, and the polymer film is etched to remove the unwanted copper. Flexible circuits are very commonly used in many electronic systems such as notebook computers, medical devices, displays, handheld devices, autos, aircraft and many others.

Flexible circuits are processed similar to that of rigid PCB's with a series of imaging, masking, drilling, via creation, plating, and trimming steps. The resulting circuit can be bent, without damaging the copper circuitry. Flexible circuits are solderable, and can have devices attached to provide some desired function. The materials used to make flexible circuits can be used in high frequency applications where the material set and design features can often provide better electrical performance than a comparable rigid circuit.

Flexible circuits are connected to electrical system in a variety of ways. In most cases, a portion of the circuitry is exposed to create a connection point. Once exposed, the circuitry can be connected to another circuit or component by soldering, conductive adhesive, thermo-sonic welding, pressure or a mechanical connector. In general, the terminals are located on an end of the flexible circuit, where edge traces are exposed or in some cases an area array of terminals are exposed. Often there is some sort of mechanical enhancement at or near the connection to prevent the joints from being disconnected during use or flexure.

In general, flexible circuits are expensive compared to some rigid PCB products. Flexible circuits also have some limitations regarding layer count or feature registration, and are therefore generally only used for small or elongated applications.

Rigid PCBs and package substrates experience challenges as the feature sizes and line spacing are reduced to achieve further miniaturization and increased circuit density. The use of laser ablation has become increasingly used to create the via structures for fine line or fine pitch structures. The use of lasers allows localized structure creation, where the processed circuits are plated together to create via connections from one layer to another. As density increases, however, laser processed via structures can experience significant taper, carbon contamination, layer-to-layer shorting during the plating process due to registration issues, and high resistance interconnections that may be prone to result in reliability issues. The challenge of making fine line PCBs often relates to the difficulty in creating very small or blind and buried vias.

BRIEF SUMMARY OF THE INVENTION

The present disclosure is directed to a high performance electrical interconnect that will enable next generation electrical performance. The present disclosure merges the long-term performance advantages of traditional PCB and semiconductor packaging with the flexibility of additive printing technology. By combining methods used in the PCB fabrication and semiconductor packaging industries, the present disclosure enables fine line high density circuit structures with attractive cost of manufacture.

The present disclosure includes adding a bulk material to create the vias and other circuit geometry to supplement or replace the traditional circuit production techniques. For example, the copper plating technique substantially fills the recesses and results in a full metal or solid copper conductive pillar (See e.g., FIGS. 1-9). Bulk copper has a well documented resistivity of about $1.68 \times 10^{-6}$ Ohm-cm. (See e.g., http://hyperphysics.phy-astr.gsu.edu/hbase/Tables/rstiv.html). This approach enables the production of very small low resistance vias to increase density and reduce line and feature pitch of the circuits as well as a host of electrical enhancements that provide an electrical interconnect that may prove to be superior to the traditional methods. In basic terms, the structure leverages methods used in the semiconductor packaging industry such as stud bumping, ball bonding, flip chip, or pillar termination or discrete particles or spheres of copper, solder or precious metal to act as the via connecting layers within the circuit stack.

The present high performance electrical interconnect can be treated as a system of its own by incorporating electrical devices or other passive and active function, such as for example, ground planes, power planes, electrical connections to other circuit members, dielectric layers, conductive traces, transistors, capacitors, resistors, RF antennae, shielding, filters, signal or power altering and enhancing devices, memory devices, embedded IC, and the like. In some embodiments, the electrical devices can be formed using printing technology, adding intelligence to the interconnect assembly.

The present high performance electrical interconnect can be produced digitally, without tooling or costly artwork. The high performance electrical interconnect can be produced as a "Green" product, with dramatic reductions in environmental issues related to the production of conventional flexible circuits.

The vias and associated circuit geometry can be printed in a variety of shapes and sizes, depending on the terminal structure on the circuit members. The contact members and vias can be positioned at a variety of locations, heights, or spacing to match the parameters of existing connections.

The use of additive printing processes permits the material set in a given layer to vary. Traditional PCB and flex circuit fabrication methods take sheets of material and stack them up, laminate, and/or drill. The materials in each layer are limited to the materials in a particular sheet. Additive printing technologies permit a wide variety of materials to be applied on a layer with a registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

The present disclosure is directed to an electrical interconnect including a first circuitry layer with a first surface and a second surface. A first liquid dielectric layer is imaged directly on the first surface of the first circuitry layer to form a first dielectric layer with a plurality of first recesses. Conductive plating substantially fills a plurality of the first recesses to create a plurality of first solid copper conductive pillars electrically coupled to, and extending generally perpendicular to, the first circuitry layer. A second liquid dielectric layer is imaged directly on the first dielectric layer to form a second dielectric layer with a plurality of second recesses. Conductive plating substantially fills a plurality of the second recesses to form a plurality of second solid copper conductive pillars electrically coupled to, and extending parallel with, the first conductive pillars. An IC device is electrically coupled to a plurality of the second conductive pillars.

The present disclosure is directed to an electrical interconnect including a first circuitry layer with a first surface and a second surface. At least a first dielectric layer is printed on the first surface of the first circuitry layer to include a plurality of first recesses. A conductive material is deposited in a plurality of the first recesses to form a plurality of first conductive pillars electrically coupled to, and extending generally perpendicular to, the first circuitry layer. At least a second dielectric layer is printed on the first dielectric layer to include a plurality of second recesses generally aligned with a plurality of the first conductive pillars. A conductive material is deposited in a plurality of the second recesses to form a plurality of second conductive pillars electrically coupled to, and extending parallel the first conductive pillars.

An IC device can be electrically coupled to a plurality of the second conductive pillars. The IC device can be electrically coupled by one of a flip chip attachment directly to a plurality of third pillars, solder balls, or wire bonding.

A second circuitry layer is optionally located on the second dielectric layer and electrically coupled with a plurality of the second conductive pillars. At least a third dielectric layer is printed on the second dielectric layer to include a plurality of third recesses generally aligned with a plurality of the second conductive pillars. In one embodiment, portions of the second circuitry layer located in the third recesses are etched away to expose a plurality of the second conductive pillars. In another embodiment, a conductive material deposited in a plurality of the third recesses to form a plurality of third conductive pillars electrically coupled to, and extending parallel the second conductive pillars. An IC device including a plurality of contact pads is electrically coupled to a plurality of the third conductive pillars. The IC device is electrically coupled by one of a flip chip attachment directly to a plurality of third pillars, solder balls, or wire bonding. In yet another embodiment, a third circuitry layer is located on the third dielectric layer. A covering layer extends across the third circuitry layer. The covering layer includes a plurality of openings exposing contact pads on the third circuitry layer configured to electrically couple with an IC device.

A covering layer optionally extends across the second surface of the first circuitry layer. The covering layer includes a plurality of openings exposing a plurality of contact pads on the first circuitry layer adapted to electrically couple with a PCB. A dielectric material is optionally printing in one or more of the recesses to surround one or more conductive pillars. The conductive material can be one of sintered conductive particles or a conductive ink.

At least one printed electrical device is optionally located on one of the dielectric layers and electrically coupled to at least a portion of the circuitry layers.

The present disclosure is also directed to a method of making an electrical interconnect. At least a first dielectric layer is printed on the first surface of a first circuitry layer to include a plurality of first recesses. A conductive material is printed in a plurality of the first recesses to form a plurality of first conductive pillars electrically coupled to, and extending generally perpendicular to, the first circuitry layer. At least a second dielectric layer is printed on the first dielectric layer to include a plurality of second recesses generally aligned with a plurality of the first conductive pillars. A conductive material is printed in a plurality of the second recesses comprising a plurality of second conductive pillars electrically coupled to, and extending parallel the first conductive pillars.

The present disclosure is also directed to several additive processes that combine the mechanical or structural properties of a polymer material, while adding metal materials in an unconventional fashion, to create electrical paths that are refined to provide electrical performance improvements. By adding or arranging metallic particles, conductive inks, plating, or portions of traditional alloys, the high performance electrical interconnect reduces parasitic electrical effects and impedance mismatch, potentially increasing the current carrying capacity.

The present high performance electrical interconnect can serve as a platform to add passive and active circuit features to improve electrical performance or internal function and intelligence. For example, electrical features and devices are printed onto the interconnect assembly using, for example, inkjet printing technology or other printing technologies. The ability to enhance the high performance electrical interconnect, such that it mimics aspects of an IC package and a PCB, allows for reductions in complexity for the IC package and the PCB, while improving the overall performance of the interconnect assembly.

The printing process permits the fabrication of functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

DETAILED DESCRIPTION OF THE INVENTION

A high performance electrical interconnect according to the present disclosure may permit fine contact-to-contact spacing (pitch) on the order of less than 1.0 mm pitch, and more preferably a pitch of less than about 0.7 millimeter, and most preferably a pitch of less than about 0.4 millimeter. Such fine pitch high performance electrical interconnects are especially useful for communications, wireless, and memory devices.

The present high performance electrical interconnect can be configured as a low cost, high signal performance interconnect assembly, which has a low profile that is particularly useful for desktop and mobile PC applications. IC devices can be installed and uninstalled without the need to reflow solder. The solder-free electrical connection of the IC devices is environmentally friendly.

Figure 1:
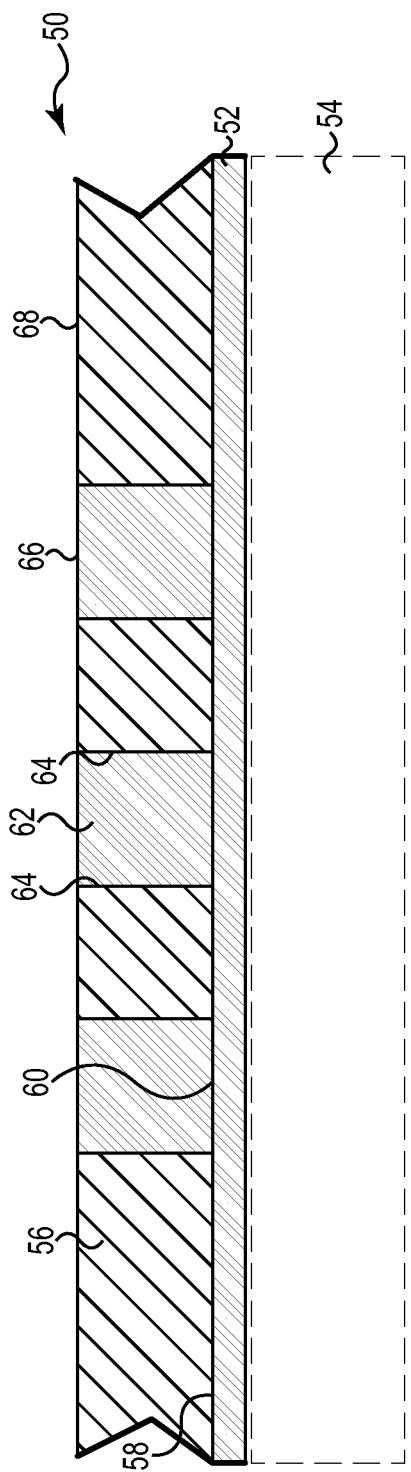
FIG. 1 is a cross-sectional view of a method of making a high performance electrical interconnects in accordance with an embodiment of the present disclosure.

FIG. 1 is a side cross-sectional view of a method of making an electrical interconnect 50 using additive processes in accordance with an embodiment of the present disclosure. FIG. 1 shows the basic structure of copper foil circuitry layer 52 only as the base layer. In an alternate embodiment, the circuitry layer 52 can be applied to any substrate or target structural element 54, such as a traditional PCB or laminated to a stiffening layer or core, such as glass-reinforced epoxy laminate sheets (e.g., FR4). The circuitry layer 52 can be preformed or can be formed using a fine line imaging step is conducted to etch copper foil as done with many PCB processes.

Dielectric material 56 is applied to surface 58 such that the circuitry 52 is at least partially encased and isolated. The dielectric material 56 can be a film or a liquid dielectric. The dielectric material 56 is typically imaged to expose the desired circuit locations 60. In some embodiments, it may be desirable to use a preformed dielectric film to leave air dielectric gaps between traces. Recesses 64 in the dielectric layer 56 that expose circuitry 52 can be formed by printing, embossing, imprinting, chemical etching with a printed mask, or a variety of other techniques.

In a normal construction, the core dielectric material would be processed to enable electro-less copper plating to adhere to the side walls. In the present embodiment, the dielectric 56 is left as a resist to enable electro-less or electrolytic copper plating to adhere only to the exposed portion 60 of the circuitry layer 52 in order to grow a full metal or solid metal conductive pillar or via structure 62 within the imaged openings 64. The resulting solid copper pillar exhibits a well-known bulk resistivity of about $1.68 \times 10^{-6}$ Ohm-cm. The remainder of the interconnect 50 remains un-plated. The support structure 54 acts as a resist to prevent copper plating on the underside 68 of the foil. Alternatively, a resist can be applied to the underside 68 to prevent plating.

If the electrical interconnect 50 is to be part of a flexible circuit, the base layer 54 can be a material such as polyimide or liquid crystal polymer. If the final product is a rigid circuit board, the base layer 54 can be FR4 or one of many high speed laminates or substrates. If the final product is a semiconductor package, the base layer 54 can be a material such as FR4, BT resin of any one of a variety of laminate or substrate materials.

The plating process can be controlled to a certain degree, but in some cases with fine pitch geometries and high speed circuits, upper surfaces 66 of the copper pillars 62 may vary in topography or height relative to the field, and the dielectric material 56 may vary in thickness slightly especially if liquid material is used. Consequently, it is preferred to planarize to surfaces 66 of the pillars 62 and the exposed surface 68 of the dielectric 56 between steps to control thickness and flatness of the electrical interconnect 50.

Figure 2:
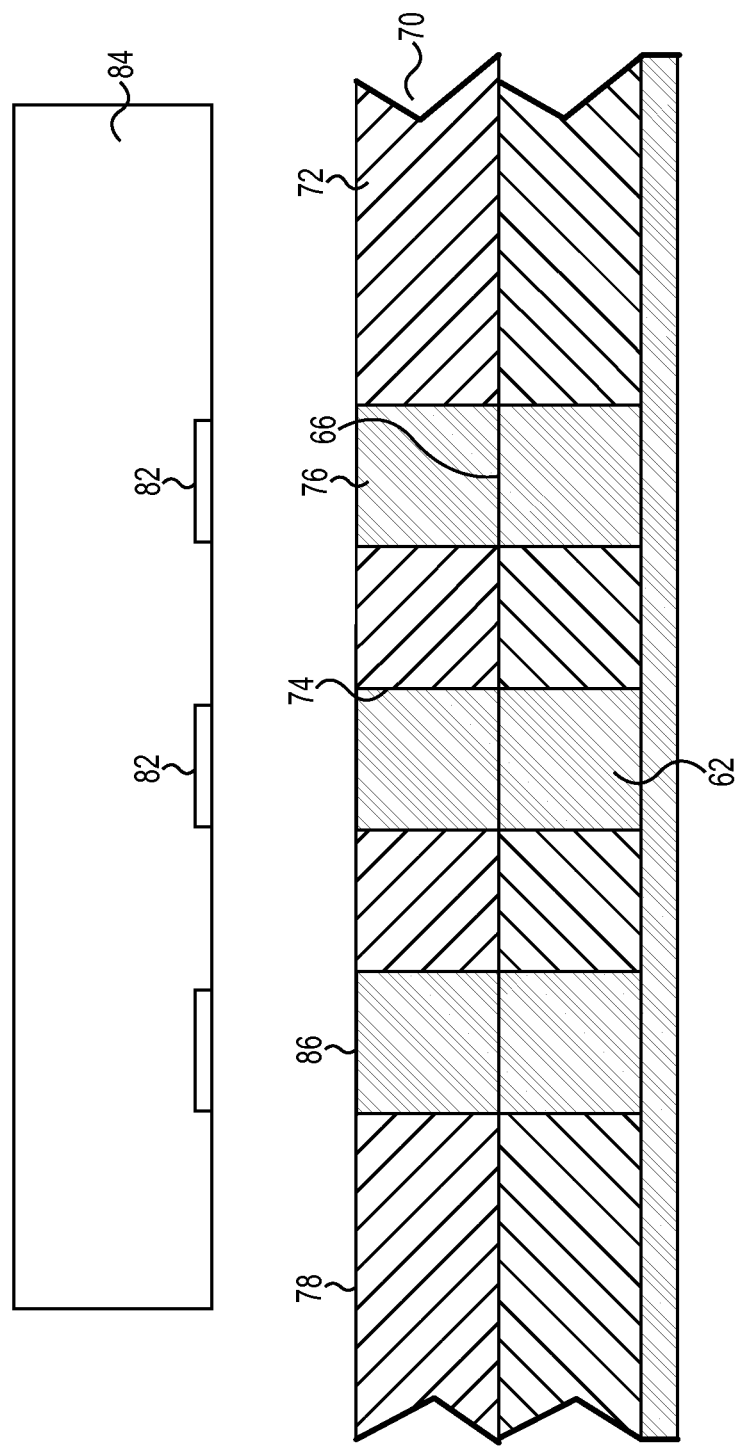
FIG. 2 illustrates an optional additional layer on the high performance electrical interconnect of FIG. 1 in accordance with an embodiment of the present disclosure.

FIG. 2 illustrates higher aspect ratio conductive pillars connections formed on the electrical interconnect 50. The process discussed above is repeated by applying another layer 70 of dielectric 72 that is imaged to expose the upper surface 66 of the previous copper pillar 62. The imaged openings 74 are then plated as discussed above to create pillar extension 76 of the pillars 62. Top surface 78 is then planarized as needed.

In one embodiment, the pillars 76 are planarized to permit die attach point 82 to facilitate flip chip attach of the die 84 to the pillars 76 directly. In another embodiment, exposed surfaces 86 of the pillars can be enlarged to facilitate soldering of the die 84 to the pillars 76.

Figure 3:
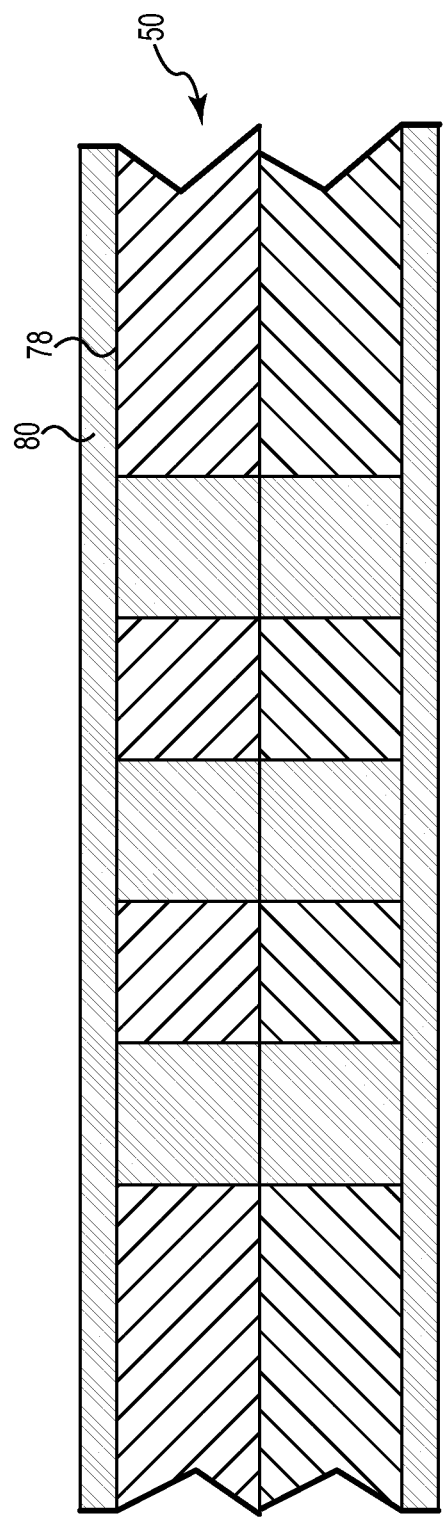
FIG. 3 illustrates application to a second circuitry layer to the high performance electrical interconnect of FIG. 1 in accordance with an embodiment of the present disclosure.

FIG. 3 illustrates circuitry layer 80 is applied to the top surface 78 of the electrical interconnect 50 to create the base for additional routing layers and to facilitate vertical connection to subsequent layers in the stack in accordance with an alternate embodiment of the present disclosure.

Figure 4:
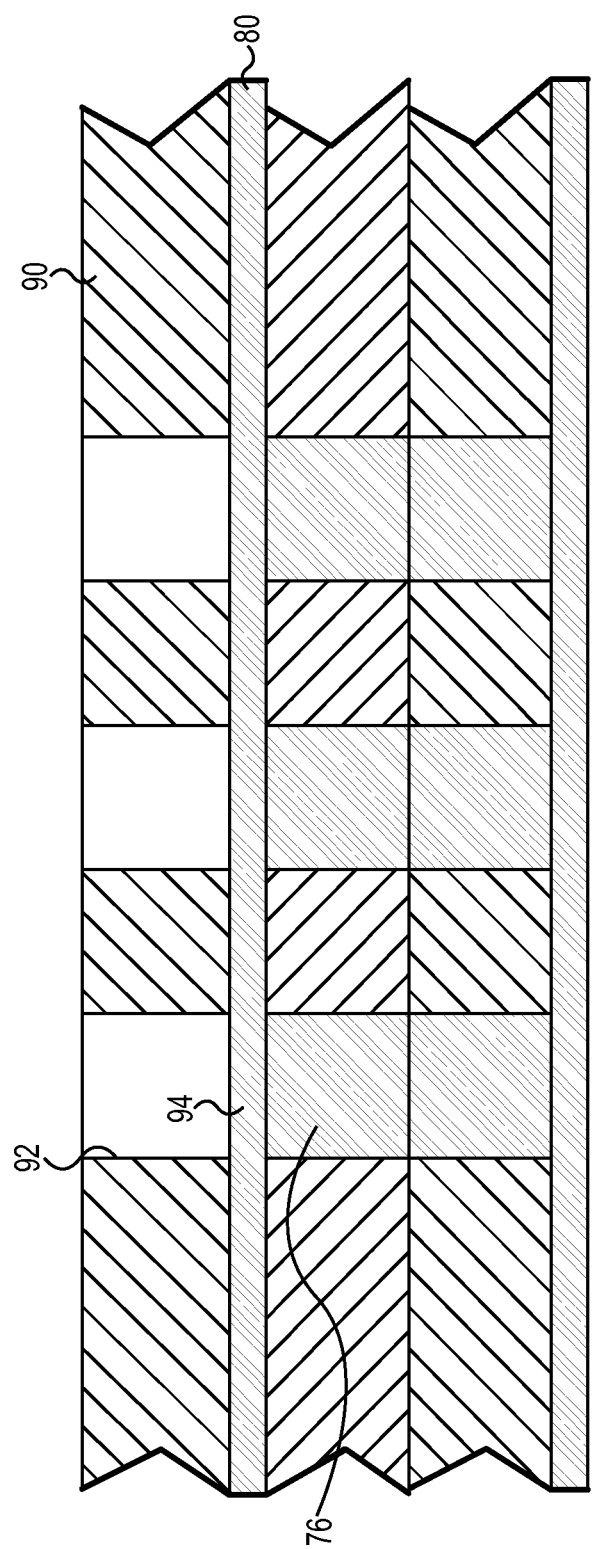
FIG. 4 illustrates an optional dielectric layer on the high performance electrical interconnect of FIG. 1 in accordance with an embodiment of the present disclosure.

FIG. 4 illustrates resist layer 90 added to the subsequent copper foil 80 in accordance with an alternate embodiment of the present disclosure. The resist layer 90 is imaged to create recesses 92 that expose portions of the copper foil 94 that corresponds with the pillar extensions 76. The resist layer 90 protects the portions of the circuitry layers 80 that are not to be etched and provides access to the foil intimate to the previous pillar 76.

Figure 5:
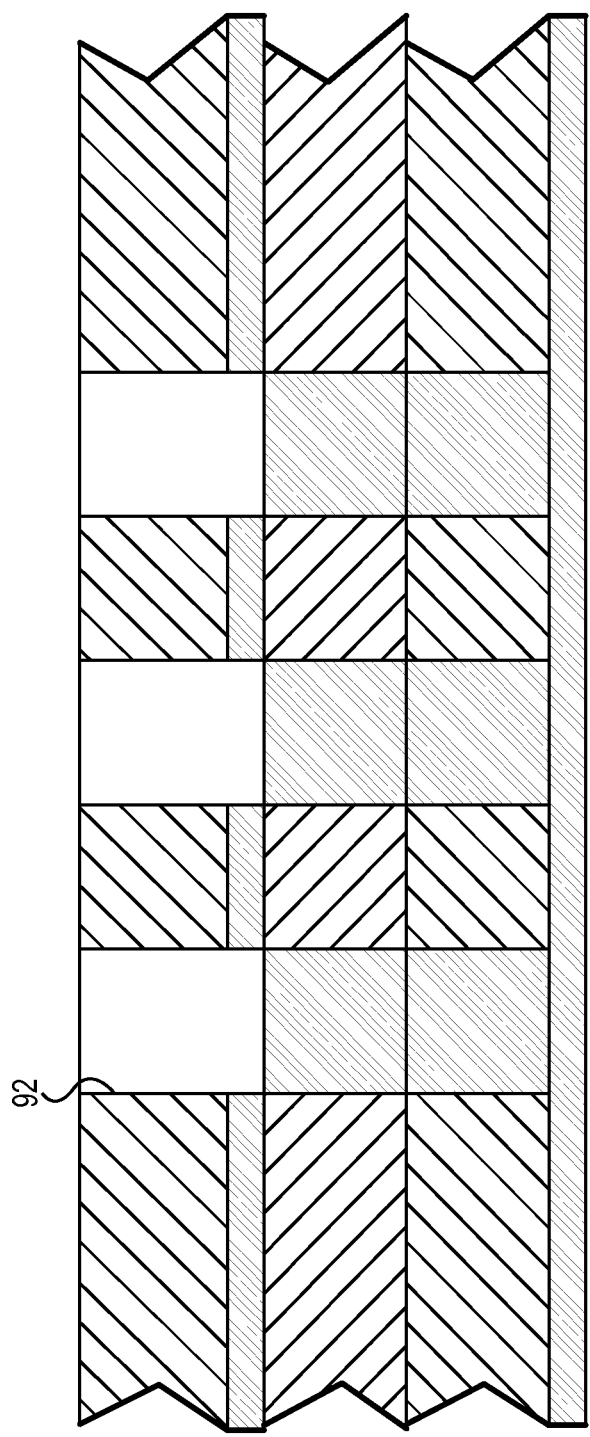
FIG. 5 illustrates an optional etching step on the high performance electrical interconnect of FIG. 1 in accordance with an embodiment of the present disclosure.

FIG. 5 illustrates a subsequent etch process that removes the copper foil 94 (see FIG. 4) located in the recesses 92 to allow access for the next plating step to join the layers together in accordance with an alternate embodiment of the present disclosure.

Depending on the resist material 90 and desired final construction, the resist layer 90 can be stripped to provide a level to be planarized as the base of further processing or the resist layer 90 can be left in place provided it is of the proper material type. The exposed regions that provided access for etch and plating can be filled with similar material to seal the layer which can be planarized for further processing if desired.

Figure 6:
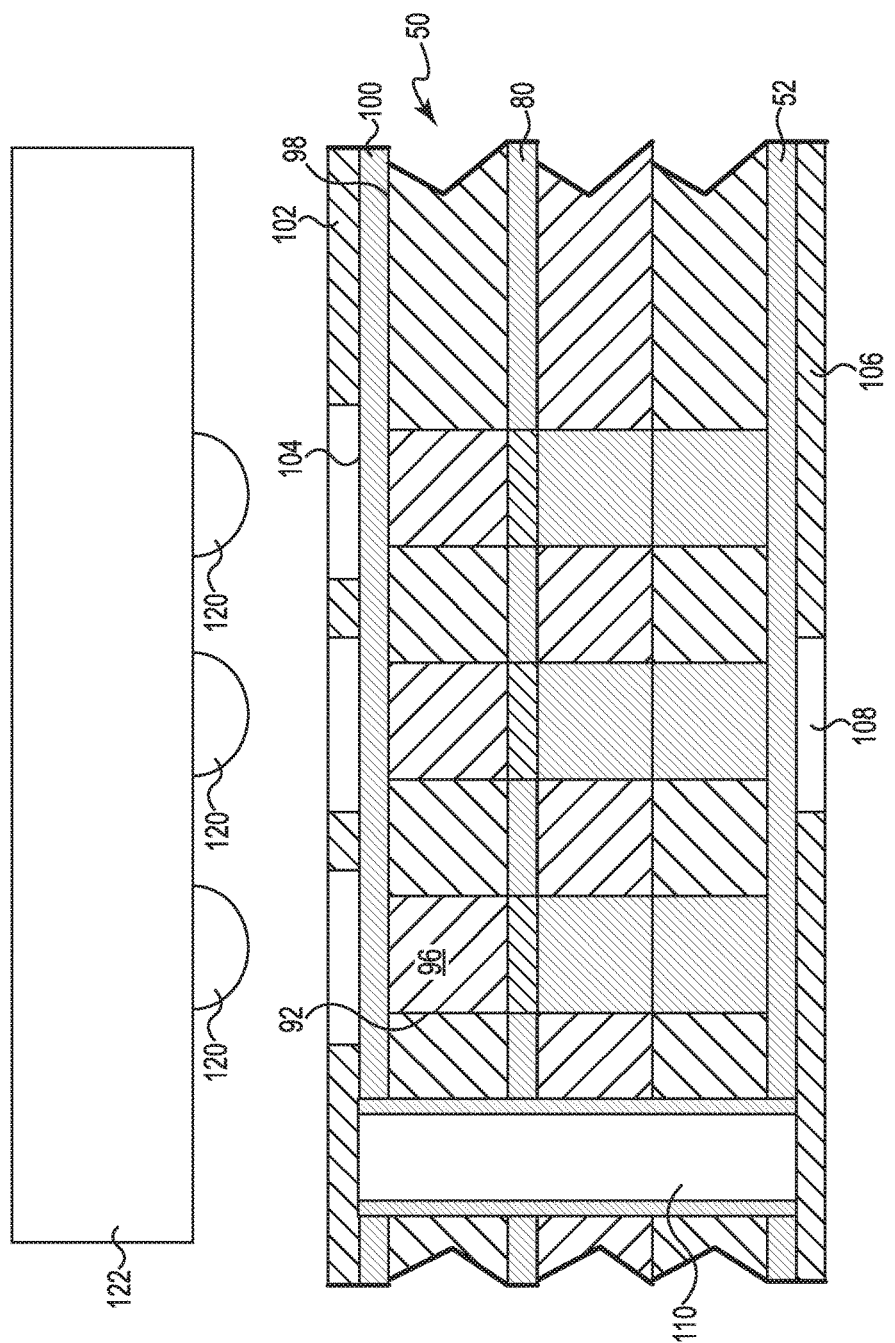
FIG. 6 illustrates an electrical interconnect interfaced with a BGA device in accordance with an embodiment of the present disclosure.

FIG. 6 illustrates one possible variation of the electrical interconnect 50 including circuitry layer 80 illustrated in FIG. 3. Recesses 92 are filled with a dielectric material 96 and the surface 98 is planarized to receive circuitry plane 100. Dielectric layer 102 is deposited on the circuitry plane 100 to expose selective regions 104. The selective regions 104 are configured to correspond to solder balls 120 on BGA device 122. In the illustrated embodiment, bottom dielectric layer 106 is optionally deposited on circuitry layer 52 in a manner to expose selective regions 108.

In one embodiment, the electrical interconnect 50 is further processed with conventional circuit fabrication processes to create larger diameter through vias or through holes plated 110 as needed, solder mask applied and imaged to expose device termination locations 104, 108, laser direct imaging, legend application etc.

Figure 7:
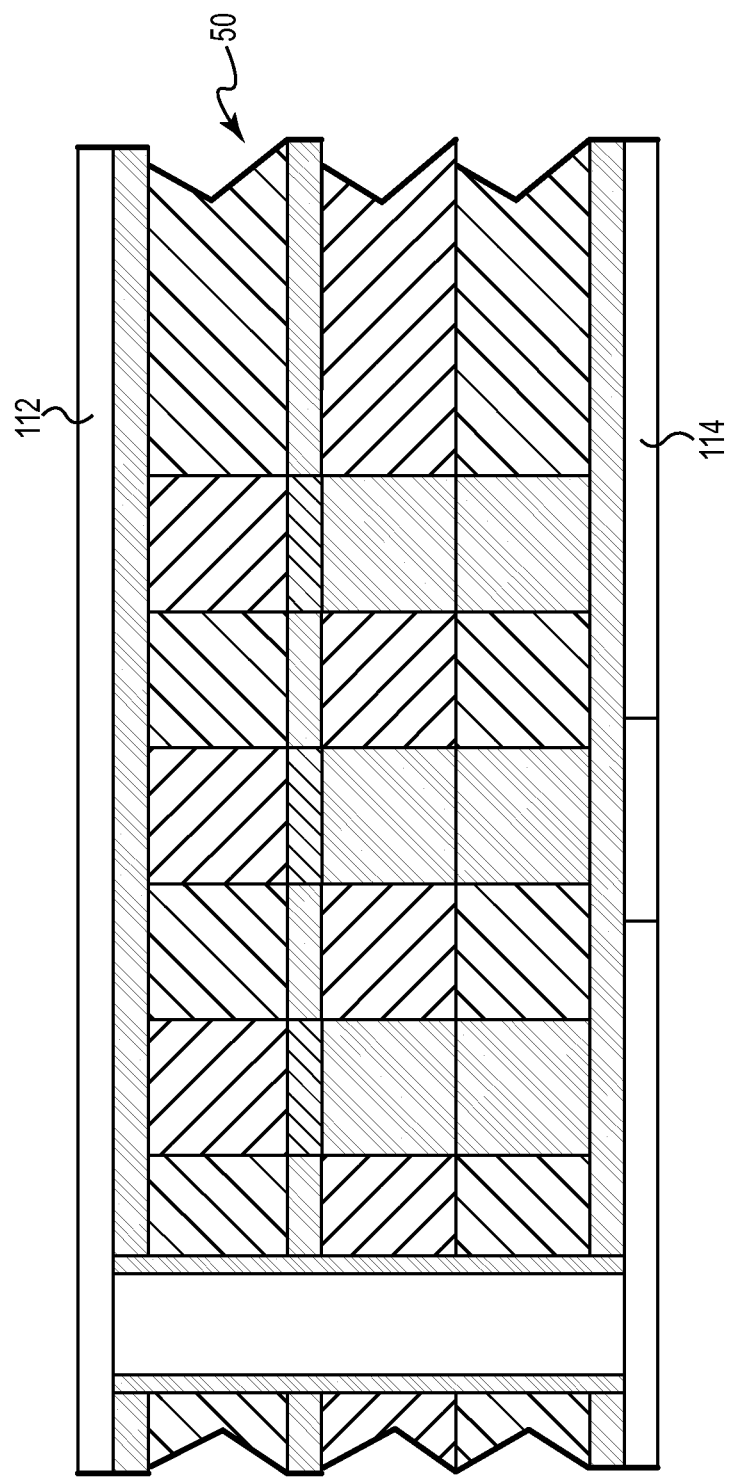
FIG. 7 illustrates an electrical interconnect for a flexible circuit in accordance with an embodiment of the present disclosure.

FIG. 7 illustrate an alternate embodiment in which the electrical interconnect 50 is used in a flexible circuit applications. The electrical interconnect 50 is laminated with ground planes and cover layers 112, 114. In some applications the insulating layers 112, 114 are applied by jet printing of polyimide or liquid crystal polymers (LCP) inks as a final layer or as a combination of laminated film and jetted material.

Figure 8:
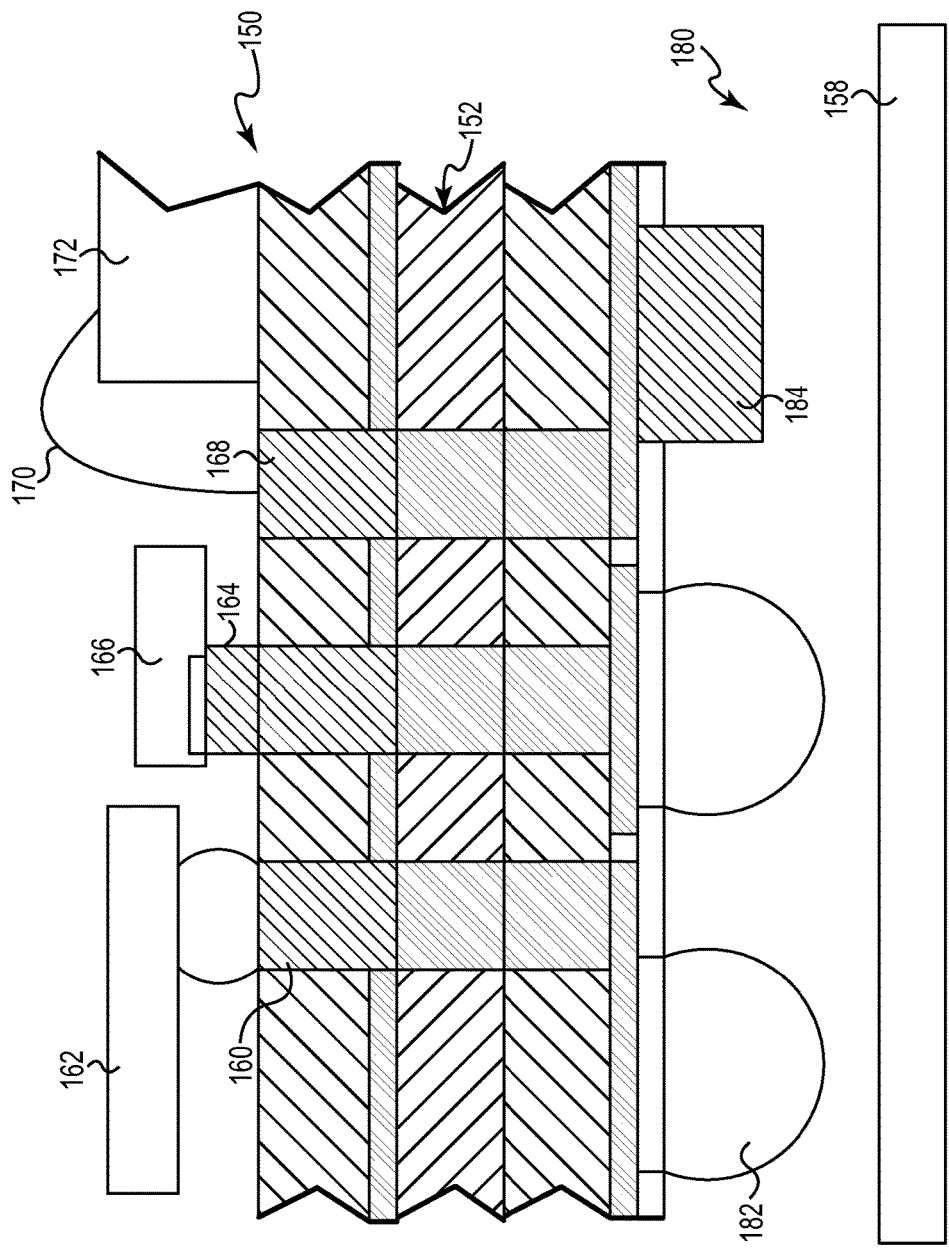
FIG. 8 illustrates an electrical interconnect for an IC package in accordance with an embodiment of the present disclosure.

FIG. 8 illustrates an electrical interconnect 150 for semiconductor packaging applications in accordance with an embodiment of the present disclosure. The stack 152 can be final processed with a variety of options to facilitate electrical connections to IC devices 162, 166, 172 and to system level attachment to PCB 158.

In one embodiment, the pillars 160 are planarized to facilitate flip chip attach to the pillar directly (see e.g., FIG. 2) or to receive BGA device 162. In other embodiment, pillars 164 are extended to facilitate direct soldering of IC device die 166 with paste. In yet another embodiment, pillars 168 is wire bonded 170 to the IC device 172.

The system interconnect side the structure 180 can be processed to accept a traditional ball grid array attachment 182 for an area array configuration or plated with solder/tin etc. for a no lead peripheral termination. The structure 180 can also be fashioned to have pillars or post extensions 184 to facilitate direct solder attach with paste and provide a natural standoff from the PCB 158.

Figure 9:
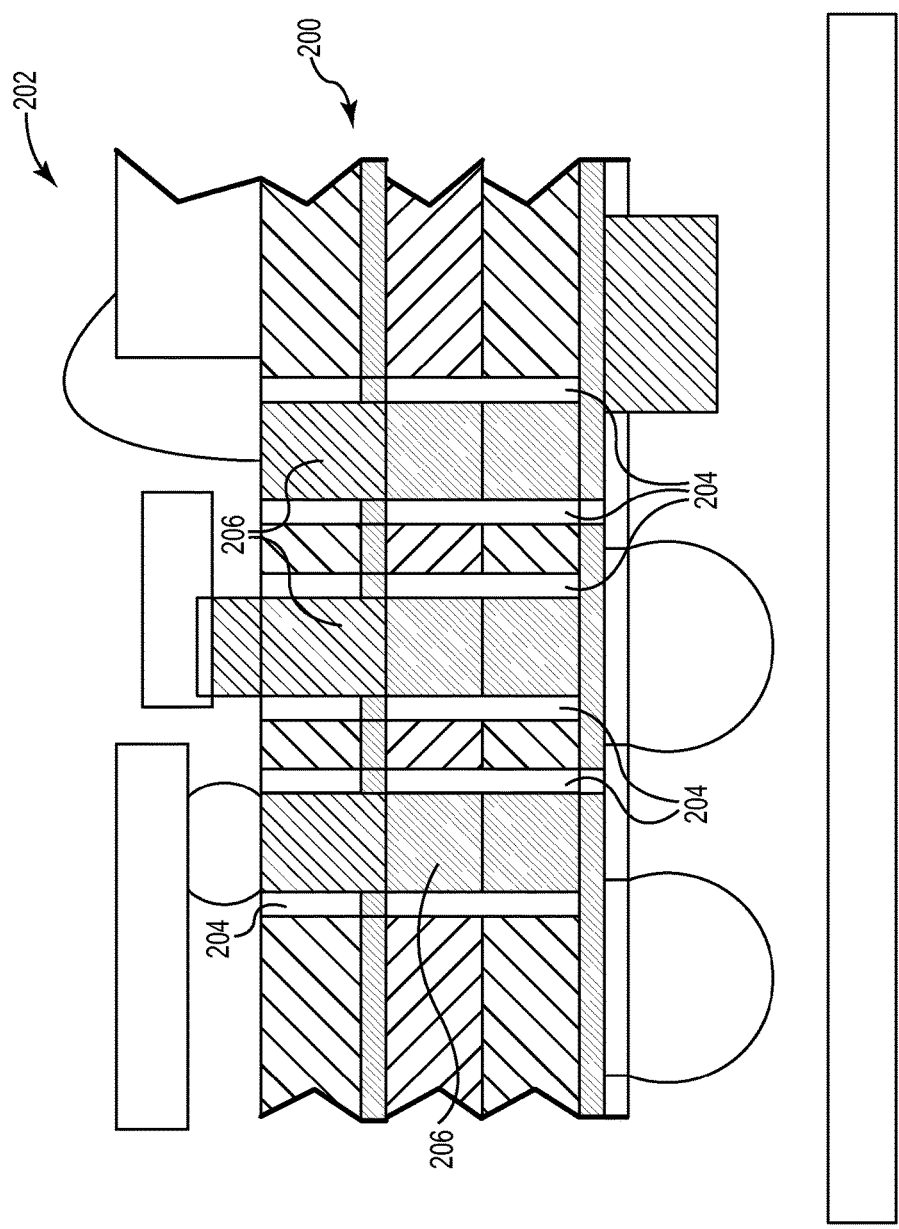
FIG. 9 illustrates an alternate electrical interconnect for an IC package in accordance with an embodiment of the present disclosure.

FIG. 9 illustrates an electrical interconnect 200 for a semiconductor package 202 with dielectric materials 204 surrounding the conductive pillars 206 in accordance with an embodiment of the present disclosure. Internal circuits and terminations may also be added by imaging or drilling the core material with a larger opening than needed and filling those openings with dielectric and imaging the desired geometry to facilitate pillar formation.

Figure 10:
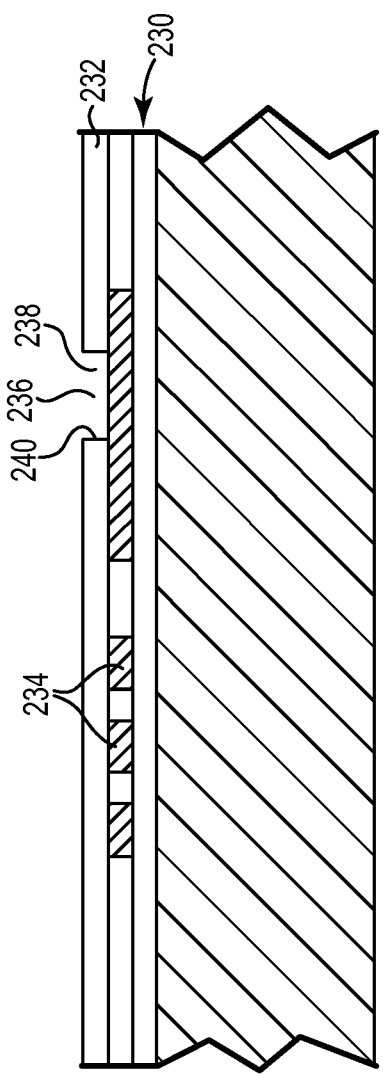
FIG. 10 is a side sectional view of an electrical interconnect in accordance with an embodiment of the present disclosure.

FIG. 10 illustrates an alternate electrical interconnect 230 with an insulating layer 232 applied to the circuit geometry 234. The nature of the printing process allows for selective application of dielectric layer 232 to leave selected portions 236 of the circuit geometry 234 expose if desired. The resulting high performance electrical interconnect 230 can potentially be considered entirely "green" with limited or no chemistry used to produce beyond the direct write materials.

The dielectric layers of the present disclosure may be constructed of any of a number of dielectric materials that are currently used to make sockets, semiconductor packaging, and printed circuit boards. Examples may include UV stabilized tetrafunctional epoxy resin systems referred to as Flame Retardant 4 (FR-4); bismaleimide-triazine thermoset epoxy resins referred to as BT-Epoxy or BT Resin; and liquid crystal polymers (LCPs), which are polyester polymers that are extremely unreactive, inert and resistant to fire. Other suitable plastics include phenolics, polyesters, and Ryton® available from Phillips Petroleum Company.

In one embodiment, one or more of the dielectric materials are designed to provide electrostatic dissipation or to reduce cross-talk between the traces of the circuit geometry. An efficient way to prevent electrostatic discharge ("ESD") is to construct one of the layers from materials that are not too conductive but that will slowly conduct static charges away. These materials preferably have resistivity values in the range of $10^5$ to $10^{11}$ Ohm-meters.

Figure 11:
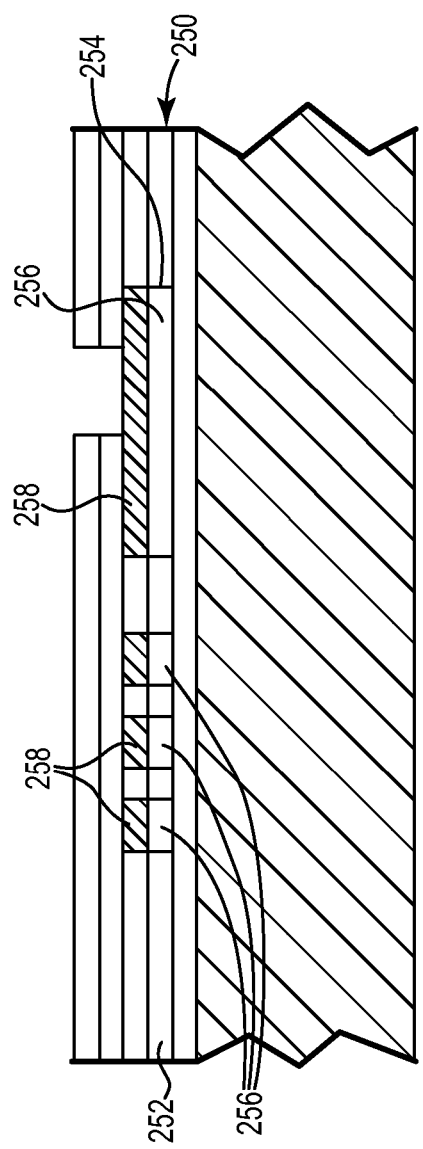
FIG. 11 is a side sectional view of an alternate electrical interconnect with printed compliant material in accordance with an embodiment of the present disclosure.

FIG. 11 illustrates an alternate high performance electrical interconnect 250 in accordance with an embodiment of the present disclosure. Dielectric layer 252 includes openings 254 into which compliant material 256 is printed before formation of circuit geometry 258. The compliant printed material 256 improves reliability during flexure of the electrical interconnect 250.

Figure 12:
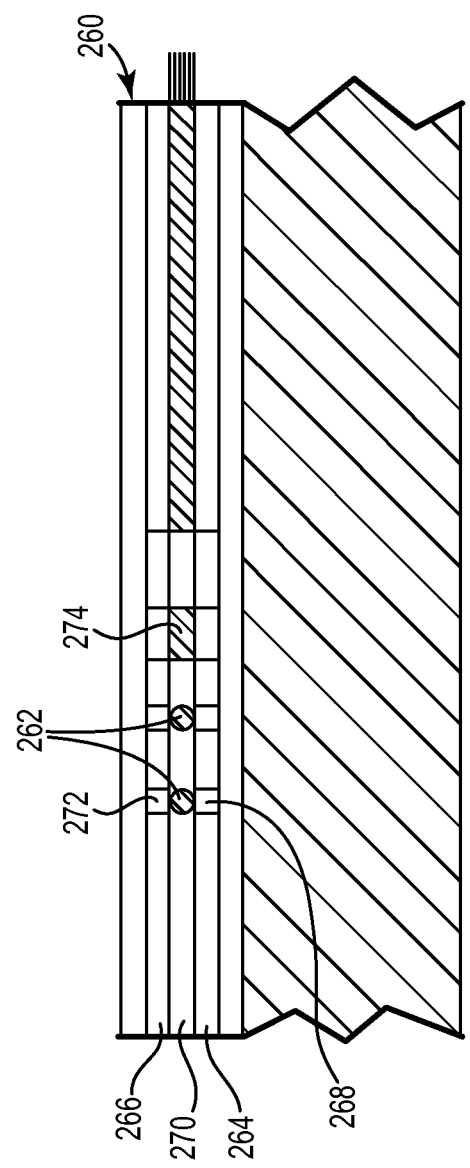
FIG. 12 illustrates an electrical interconnect with optical features in accordance with an embodiment of the present disclosure.

FIG. 12 illustrates an alternate high performance electrical interconnect 260 in accordance with an embodiment of the present disclosure. Optical fibers 262 are located between layers 264, 266 of dielectric material. In one embodiment, optical fibers 262 is positioned over printed compliant layer 268, and dielectric layer 270 is printed over and around the optical fibers 262. A compliant layer 272 is preferably printed above the optical fiber 262 as well. The compliant layers 268, 272 support the optical fibers 262 during flexure. In another embodiment, the dielectric layer 270 is formed or printed with recesses into which the optical fibers 262 are deposited.

In another embodiment, optical quality materials 274 are printed during printing of the high performance electrical interconnect 260. The optical quality material 274 and/or the optical fibers 262 comprise optical circuit geometries. The printing process allows for deposition of coatings in-situ that enhance the optical transmission or reduce loss. The precision of the printing process reduces misalignment issues when the optical materials 274 are optically coupled with another optical structure.

Figure 13:
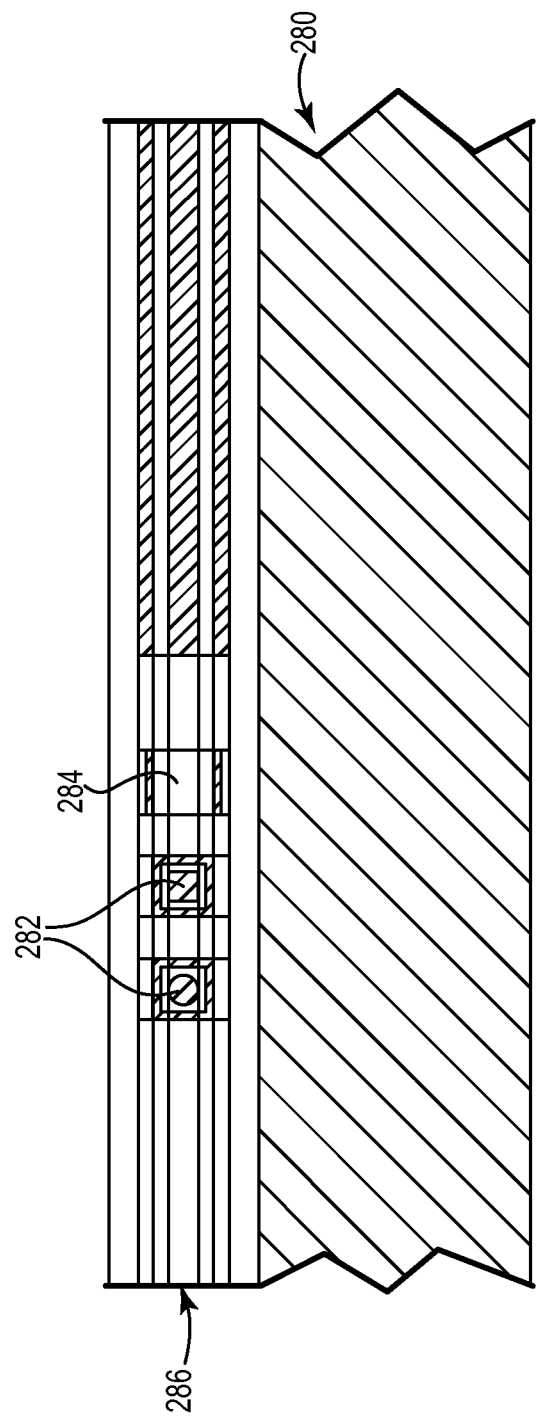
FIG. 13 illustrates an alternate high performance electrical interconnect with optical features in accordance with an embodiment of the present disclosure.

FIG. 13 illustrates another embodiment of a present high performance electrical interconnect 280 in accordance with an embodiment of the present disclosure. Embedded coaxial RF circuits 282 or printed micro strip RF circuits 284 are located with dielectric/metal layers 286. These RF circuits 282, 284 are preferably created by printing dielectrics and metallization geometry.

Figure 14:
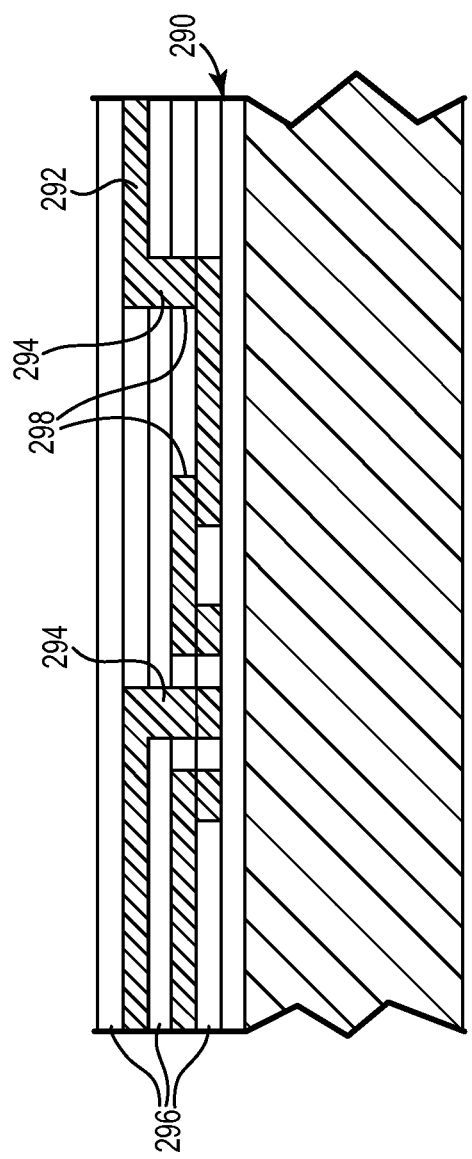
FIG. 14 illustrates an alternate high performance electrical interconnect with printed vias in accordance with an embodiment of the present disclosure.

As illustrated in FIG. 14, use of additive processes allows the creation of a high performance electrical interconnect 290 with inter-circuit, 3D lattice structures 292 having intricate routing schemes. Conductive pillars 294 can be printed with each layer, without drilling.

The nature of the printing process permit controlled application of dielectric layers 296 creates recesses 298 that control the location, cross section, material content, and aspect ratio of the conductive traces 292 and the conductive pillars 294. Maintaining the conductive traces 292 and conductive pillars 294 with a cross-section of 1:1 or greater provides greater signal integrity than traditional subtractive trace forming technologies. For example, traditional methods take a sheet of a given thickness and etches the material between the traces away to have a resultant trace that is usually wider than it is thick. The etching process also removes more material at the top surface of the trace than at the bottom, leaving a trace with a trapezoidal cross-sectional shape, degrading signal integrity in some applications. Using the recesses 298 to control the aspect ratio of the conductive traces 292 and the conductive pillars 294 results in a more rectangular or square cross-section, with the corresponding improvement in signal integrity.

In another embodiment, pre-patterned or pre-etched thin conductive foil circuit traces are transferred to the recesses 298. For example, a pressure sensitive adhesive can be used to retain the copper foil circuit traces in the recesses 298. The trapezoidal cross-sections of the preformed conductive foil traces are then post-plated. The plating material fills the open spaces in the recesses 298 not occupied by the foil circuit geometry, resulting in a substantially rectangular or square cross-sectional shape corresponding to the shape of the recesses 298.

In another embodiment, a thin conductive foil is pressed into the recesses 298, and the edges of the recesses 298 acts to cut or shear the conductive foil. The process locates a portion of the conductive foil in the recesses 298, but leaves the negative pattern of the conductive foil not wanted outside and above the recesses 298 for easy removal. Again, the foil in the recesses 298 is preferably post plated to add material to increase the thickness of the conductive traces 292 in the circuit geometry and to fill any voids left between the conductive foil and the recesses 298.

Figure 15:
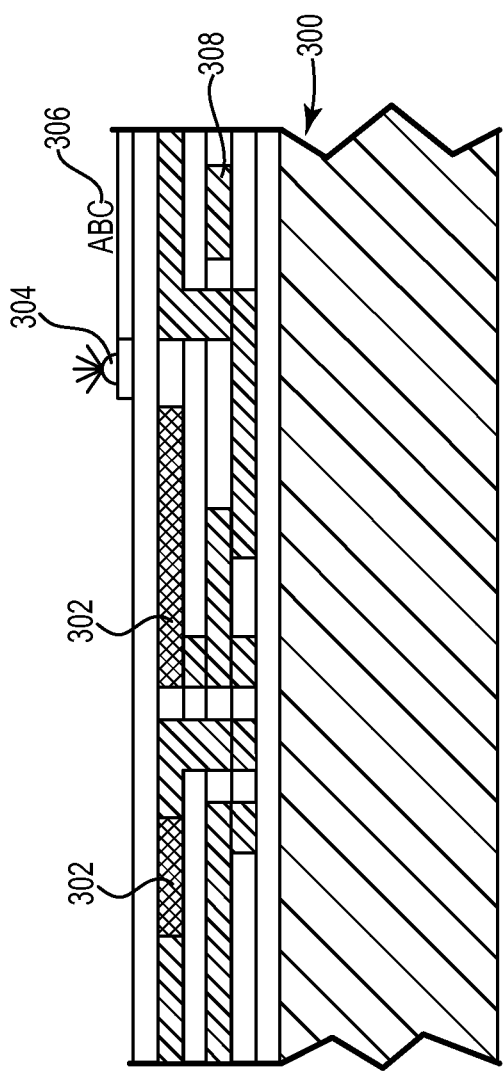
FIG. 15 illustrates an alternate high performance electrical interconnect with printed electrical devices in accordance with an embodiment of the present disclosure.

FIG. 15 illustrates a high performance electrical interconnect 300 with printed electrical devices 302. The electrical devices 302 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like. In the illustrated embodiment, electrical devices 302 include printed LED indicator 304 and display electronics 306. Geometries can also be printed to provide capacitive coupling 308. Compliant material can be added between circuit geometry, such as discussed above, so the present electrical interconnect can be plugged into a receptacle or socket, supplementing or replacing the need for compliance within the connector.

The electrical devices 302 are preferably printed during construction of the interconnect assembly 300. The electrical devices 302 can be ground planes, power planes, electrical connections to other circuit members, dielectric layers, conductive traces, transistors, capacitors, resistors, RF antennae, shielding, filters, signal or power altering and enhancing devices, memory devices, embedded IC, and the like. For example, the electrical devices 302 can be formed using printing technology, adding intelligence to the high performance electrical interconnect 300. Features that are typically located on other circuit members can be incorporated into the interconnect 300 in accordance with an embodiment of the present disclosure.

The availability of printable silicon inks provides the ability to print electrical devices 302, such as disclosed in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are hereby incorporated by reference. In particular, U.S. Pat. No. 6,506,438 (Duthaler et al.) and U.S. Pat. No. 6,750,473 (Amundson et al.), which are incorporated by reference, teach using ink-jet printing to make various electrical devices, such as, resistors, capacitors, diodes, inductors (or elements which may be used in radio applications or magnetic or electric field transmission of power or data), semiconductor logic elements, electro-optical elements, transistor (including, light emitting, light sensing or solar cell elements, field effect transistor, top gate structures), and the like.

The electrical devices 302 can also be created by aerosol printing, such as disclosed in U.S. Pat. No. 7,674,671 (Renn et al.); U.S. Pat. No. 7,658,163 (Renn et al.); U.S. Pat. No. 7,485,345 (Renn et al.); U.S. Pat. No. 7,045,015 (Renn et al.); and U.S. Pat. No. 6,823,124 (Renn et al.), which are hereby incorporated by reference.

Printing processes are preferably used to fabricate various functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

Ink jet printing of electronically active inks can be done on a large class of substrates, without the requirements of standard vacuum processing or etching. The inks may incorporate mechanical, electrical or other properties, such as, conducting, insulating, resistive, magnetic, semi conductive, light modulating, piezoelectric, spin, optoelectronic, thermoelectric or radio frequency.

A plurality of ink drops are dispensed from the print head directly to a substrate or on an intermediate transfer member. The transfer member can be a planar or non-planar structure, such as a drum. The surface of the transfer member can be coated with a non-sticking layer, such as silicone, silicone rubber, or Teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from DuPont located in Wilmington, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinyldenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181, which is incorporated herein by reference.

A protective layer can optionally be printed onto the electrical devices. The protective layer can be an aluminum film, a metal oxide coating, a polymeric film, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layer are exemplary only. Other suitable materials known to those skilled in the art having properties similar to those described above can be used in accordance with the present disclosure.

The ink-jet print head preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electro pneumatic, electrostatic, rapid ink heating, magneto hydrodynamic, or any other technique well known to those skilled in the art. The deposited ink patterns typically undergo a curing step or another processing step before subsequent layers are applied.

While ink jet printing is preferred, the term "printing" is intended to include all forms of printing and coating, including: pre-metered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; and other similar techniques.

Figure 16:
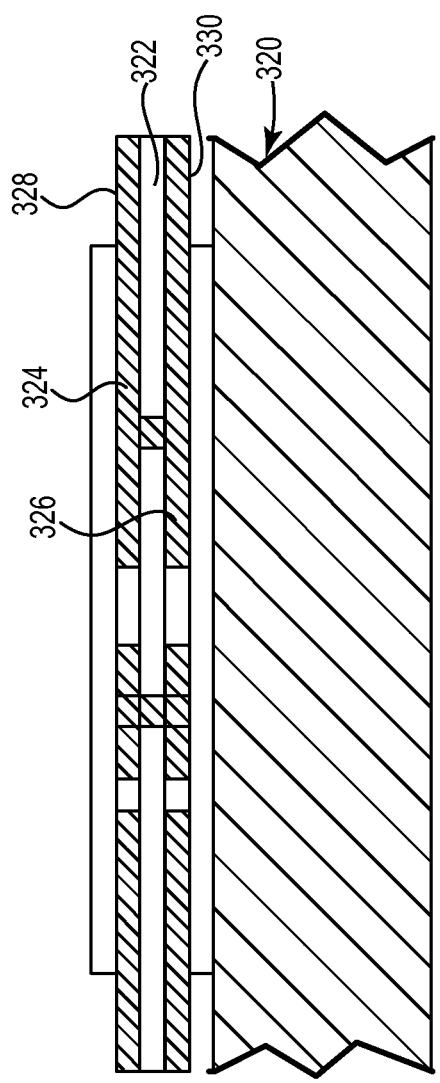
FIG. 16 illustrates an alternate high performance electrical interconnect with printed compliant electrical pads to plug into another connector in accordance with an embodiment of the present disclosure.

FIG. 16 illustrates an alternate high performance electrical interconnect 320 with printed compliant material 322 added between circuit geometries 324, 326 to facilitate insertion of exposed circuit geometries 328, 330 into a receptacle or socket. The compliant material 322 can supplement or replace the compliance in the receptacle or socket. In one embodiment, the compliance is provided by a combination of the compliant material 322 and the exposed circuit geometries 328, 330.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:
1. An electrical interconnect comprising:
a first circuitry layer comprising a first surface and a second surface;
a first dielectric layer imaged directly on the first surface of the first circuitry layer to form a first dielectric layer with a plurality of first recesses;
a conductive plating that substantially fills a plurality of the first recesses comprising a plurality of first solid copper conductive pillars electrically coupled to, and extending generally perpendicular to, the first circuitry layer and a dielectric material applied in one or more of the first recesses to surround one or more of the first solid copper conductive pillars;
a second dielectric layer imaged directly on the first dielectric layer to form a second dielectric layer with a plurality of second recesses;
a conductive plating that substantially fills a plurality of the second recesses comprising a plurality of second, solid copper conductive pillars electrically and mechanically coupled directly to, and extending parallel with, the first solid copper conductive pillars; and
an IC device electrically coupled to a plurality of the second solid copper conductive pillars.

2. The electrical interconnect of claim 1 with a printed circuit board electrically coupled to the second surface of the first circuitry layer.

3. The electrical interconnect of claim 1 comprising:
a second circuitry layer located on the second dielectric layer and electrically coupled with a plurality of the second solid copper conductive pillars; and
at least, a third dielectric layer applied on the second, dielectric layer to include a plurality of third recesses generally aligned with a plurality of the second solid copper conductive pillars.

4. The electrical interconnect of claim 3 wherein portions of the second circuitry layer aligned with the third recesses is etched away to expose a plurality of the second solid copper conductive pillars.

5. The electrical interconnect of claim 3 comprising:
a conductive material deposited in a plurality of the third recesses comprising a plurality of third solid copper conductive pillars electrically coupled to, and extending parallel with, the second solid copper conductive pillars, wherein;
a second IC device including a plurality of contact pads is electrically coupled to a plurality of the third solid copper conductive pillars, wherein the second IC device is electrically coupled by one of a flip chip attachment, directly to a plurality of the third solid copper pillars.

6. The electrical interconnect of claim 3 comprising:
a third circuitry layer located on the third dielectric layer; and
a covering layer extending across the third circuitry layer, the covering layer comprising a plurality of openings exposing contact pads on the third circuitry layer configured to electrically couple with a second IC device.

7. The electrical interconnect of claim 1 comprising a covering layer extending across the second surface of the first circuitry layer, the covering layer comprising a plurality of openings exposing a plurality of contact pads on the first circuitry layer adapted to electrically couple with a PCB.

8. The electrical interconnect of claim 1 wherein the conductive plating comprises electro-less copper plating adhered to portions of the first circuitry layer exposed by the first recesses.

9. The electrical interconnect of claim 1 wherein the first and second solid copper conductive pillars comprise a bulk resistivity of about $1.68 \times 10^{-6}$ Ohm-cm.

10. The electrical interconnect of claim 1 wherein the first and second solid copper conductive pillars comprise a full metal structure of plated copper.

11. The electrical interconnect of claim 1 comprising plating adhered to sidewalls of the first recesses to facilitate plating of the first solid copper conductive pillars.

12. The electrical interconnect of claim 1 comprising at least one printed electrical device located on one of the dielectric layers and electrically coupled to at least a portion of the first circuitry layer.

13. An electrical interconnect comprising:
a first circuitry layer comprising a first surface and a second surface;
at least a first dielectric layer applied to the first surface of the first circuitry layer to include a plurality of first recesses;
a conductive plating substantially filling a plurality of the first recesses comprising a plurality of first solid, copper conductive pillars electrically coupled to, and extending generally perpendicular to, the first circuitry layer and a dielectric material applied in one or more of the first recesses to surround one or more of the first solid copper conductive pillars;
at least a second dielectric layer applied to the first dielectric layer to include a plurality of second recesses generally aligned with a plurality of the first solid copper conductive pillars;
a conductive plating substantially filling a plurality of the second recesses comprising a plurality of second solid copper conductive pillars electrically and mechanically coupled directly to, and extending from the first solid copper conductive pillars; and
at least one printed electrical device located on one of the at least first and second dielectric layers and electrically coupled to the first circuitry layers.

14. An electrical interconnect comprising:
a first circuitry layer comprising a first surface and a second surface;
a first dielectric layer imaged directly on the first surface of the first circuitry layer to, form a first dielectric layer with a plurality of first recesses;
a conductive plating that substantially fills a plurality of the first recesses comprising a plurality of first solid copper conductive pillars electrically coupled to, and extending generally perpendicular to, the first circuitry layer and a dielectric material applied in one or more of the first recesses to surround one or more of the first solid copper conductive pillars;
a second dielectric layer imaged directly on the first dielectric layer to form a second dielectric layer with a plurality of second recesses;
a conductive plating that substantially fills a plurality of the second recesses comprising a plurality of second solid copper conductive pillars electrically and mechanically coupled directly to, and extending generally parallel to, the first solid copper conductive pillars;
a second circuitry layer located on the second dielectric layer and electrically coupled with a plurality of the second solid copper conductive pillars; and
at least a third dielectric layer located on the second dielectric layer to include a plurality of third recesses generally aligned with a plurality of the second solid copper conductive pillars, wherein portions of the second circuitry layer aligned with the third recesses are etched away to expose a plurality of the second solid copper conductive pillars.

15. An electrical interconnect comprising:
a first circuitry layer comprising a first surface and a second surface;
a first dielectric layer imaged directly on the first surface of the first circuitry layer to form a first dielectric layer with a plurality of first recesses;
a conductive plating that substantially fills a plurality of the first recesses comprising a plurality of first solid, copper conductive pillars electrically coupled to, and extending generally perpendicular to, the first circuitry layer and a dielectric material applied in one or more of the first recesses to surround one or more of the first solid copper conductive pillars;
a second dielectric layer imaged directly on the first dielectric layer to form a second dielectric layer with a plurality of second recesses;
a conductive plating that substantially fills a plurality of the second recesses comprising a plurality of second solid copper conductive pillars electrically coupled to, and extending, generally parallel the first solid copper conductive pillars;

a second circuitry layer located on the second dielectric layer and electrically coupled with a plurality of the second solid copper conductive pillars;

at least a third dielectric layer located on the second dielectric layer to, include a plurality of third recesses generally aligned with a plurality of the second solid copper conductive pillars;

a third, circuitry layer located on the third dielectric layer; and a covering layer extending across the third circuitry layer, the covering layer comprising a plurality of openings exposing contact pads on the third circuitry layer configured to electrically couple with an IC device.

16. An electrical interconnect comprising:

a first circuitry layer comprising a first surface and a second surface;

a first dielectric layer imaged directly on the first surface of the first circuitry layer to form a first dielectric layer with a plurality of first recesses;

a conductive plating substantially filling a plurality of the first recesses comprising a plurality of first solid, copper conductive pillars electrically coupled to, and extending generally perpendicular to, the first circuitry layer and a dielectric material applied in one or more of the first recesses to surround one or more of the first solid copper conductive pillars;

a second dielectric layer imaged directly on the first dielectric layer to form a second dielectric layer with a plurality of second recesses;

a conductive plating substantially filling a plurality of the second recesses comprising a plurality of second solid copper conductive pillars electrically coupled to, and extending generally parallel the first solid copper conductive pillars;

a second circuitry layer located on the second dielectric layer and electrically coupled with a plurality of the second solid copper conductive pillars;

at least a third dielectric layer located on the second dielectric layer to include a plurality of third recesses generally aligned with, a plurality of the second solid copper conductive pillars; and a covering layer extending across the second surface of the first circuitry layer, the covering layer comprising a plurality of openings exposing a plurality of contact pads on the first circuitry layer adapted to electrically couple with a PCB.

* * * * *